United States Patent
Luethi et al.

(10) Patent No.: US 12,050,966 B2
(45) Date of Patent: Jul. 30, 2024

(54) QUANTUM DOT BASED QUBIT DEVICES WITH ON-CHIP MICROCOIL ARRANGEMENTS

(71) Applicant: Intel Corporation, Santa Clara, CA (US)

(72) Inventors: Florian Luethi, Portland, OR (US); Hubert C. George, Portland, OR (US); Felix Frederic Leonhard Borjans, Portland, OR (US); Simon Schaal, Hillsboro, OR (US); Lester Lampert, Portland, OR (US); Thomas Francis Watson, Portland, OR (US); Jeanette M. Roberts, North Plains, OR (US); Jong Seok Park, Hillsboro, OR (US); Sushil Subramanian, Hillsboro, OR (US); Stefano Pellerano, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 314 days.

(21) Appl. No.: 17/555,717

(22) Filed: Dec. 20, 2021

(65) Prior Publication Data

US 2023/0196152 A1    Jun. 22, 2023

(51) Int. Cl.
*G06N 10/00* (2022.01)
*H01L 29/12* (2006.01)

(52) U.S. Cl.
CPC .............. *G06N 10/00* (2019.01); *H01L 29/12* (2013.01)

(58) Field of Classification Search
CPC ........ G06N 10/00; G06N 10/40; G06N 10/20; H01L 29/12; H01L 27/0617; H01L 28/10;
(Continued)

(56) References Cited

U.S. PATENT DOCUMENTS 11,417,765 B2 *  8/2022  Thomas ............ H01L 29/66977
11,704,586 B2 *  7/2023  Thom .................... G06N 10/00
                                                                 707/728
(Continued)

FOREIGN PATENT DOCUMENTS

DE    102016120884 A1    5/2018
WO      2021092661 A1    5/2021

OTHER PUBLICATIONS

Koppens, F. H., et al. "Driven coherent oscillations of a single electron spin in a quantum dot." Nature, vol. 442, No. 7104, Aug. 2006, pp. 766-771, https://doi.org/10.1038/nature05065. (Year: 2006).*

(Continued)

*Primary Examiner* — J. E. Schoenholtz
(74) *Attorney, Agent, or Firm* — Akona IP PC

(57) ABSTRACT

An array of quantum dot qubits (e.g., an array of spin qubits) relies on a gradient magnetic field to ensure that the qubits are separated in frequency in order to be individually addressable. Furthermore, a strong magnetic field gradient is required to electrically drive the electric dipole spin resonance (EDSR) of the qubits. Quantum dot devices disclosed herein use microcoil arrangements for providing a gradient magnetic field, the microcoil arrangements integrated on the same chip (e.g., on the same die or wafer) as quantum dot qubits themselves. Unlike previous approaches to quantum dot formation and manipulation, various embodiments of the quantum dot devices disclosed herein may enable improved control over magnetic fields and their gradients to realize better frequency targeting of individual qubits, help minimize adverse effects of charge noise on qubit decoherence and provide good scalability in the number of quantum dots included in the device.

20 Claims, 22 Drawing Sheets

(58) Field of Classification Search
CPC . H01L 29/423; H01L 29/66984; H01L 29/82; H01L 29/66977; B82Y 10/00
See application file for complete search history.

(56) References Cited

U.S. PATENT DOCUMENTS

| | | | |
|---|---|---|---|
| 11,917,929 B1* | 2/2024 | Pan | H10N 60/855 |
| 2005/0276149 A1* | 12/2005 | Allenspach | G11C 11/14 365/232 |
| 2010/0270534 A1 | 10/2010 | Pioro-Ladriere et al. | |
| 2013/0264617 A1 | 10/2013 | Joshi et al. | |
| 2015/0357112 A1 | 12/2015 | Rochemont | |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0164959 A1 | 5/2019 | Thomas et al. | |
| 2019/0165152 A1 | 5/2019 | Roberts et al. | |
| 2019/0181256 A1* | 6/2019 | Roberts | H01L 29/66 |
| 2019/0194016 A1 | 6/2019 | Roberts et al. | |
| 2019/0198618 A1 | 6/2019 | George et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0214385 A1 | 7/2019 | Roberts et al. | |
| 2019/0221659 A1 | 7/2019 | George et al. | |
| 2019/0229188 A1 | 7/2019 | Clarke et al. | |
| 2019/0229189 A1 | 7/2019 | Clarke et al. | |
| 2019/0252377 A1 | 8/2019 | Clarke et al. | |
| 2019/0259850 A1 | 8/2019 | Pillarisetty et al. | |
| 2019/0266511 A1 | 8/2019 | Pillarisetty et al. | |
| 2019/0267692 A1 | 8/2019 | Roberts et al. | |
| 2019/0273197 A1 | 9/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0334020 A1 | 10/2019 | Amin et al. | |
| 2019/0341459 A1 | 11/2019 | Pillarisetty et al. | |
| 2019/0363181 A1* | 11/2019 | Pillarisetty | H01L 29/0673 |
| 2019/0363239 A1 | 11/2019 | Yoscovits et al. | |
| 2020/0003925 A1 | 1/2020 | Leipold et al. | |
| 2020/0161455 A1 | 5/2020 | Singh et al. | |

OTHER PUBLICATIONS

Hsu, M.C. et al."The Inductance Enhancement Study of Spiral Inductor Using Ni-AAO Nanocomposite Core", IEEE Transactions on Nanotechnology, vol. 8, No. 3, May 1, 2009, pp. 281-285.

* cited by examiner

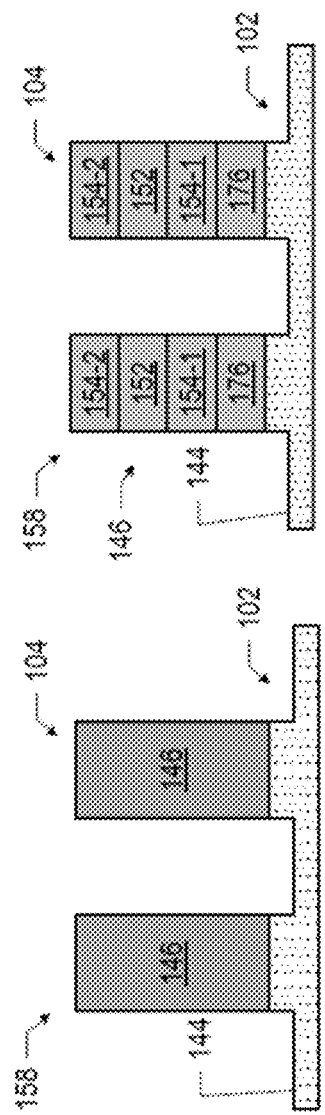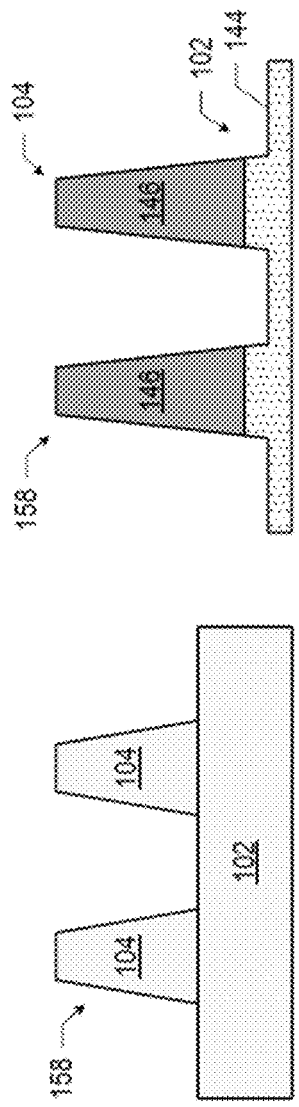

QUANTUM DOT BASED QUBIT DEVICES WITH ON-CHIP MICROCOIL ARRANGEMENTS

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices. Quantum computing devices that rely on formation of quantum dots (referred to herein as "quantum dot based qubit devices" or, simply, "quantum dot devices") are particularly promising for large-scale qubit implementation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 13-19 illustrate example base/fin arrangements that may be used in a quantum dot device with fins, in accordance with various embodiments.

DETAILED DESCRIPTION

Overview

Figure 1:
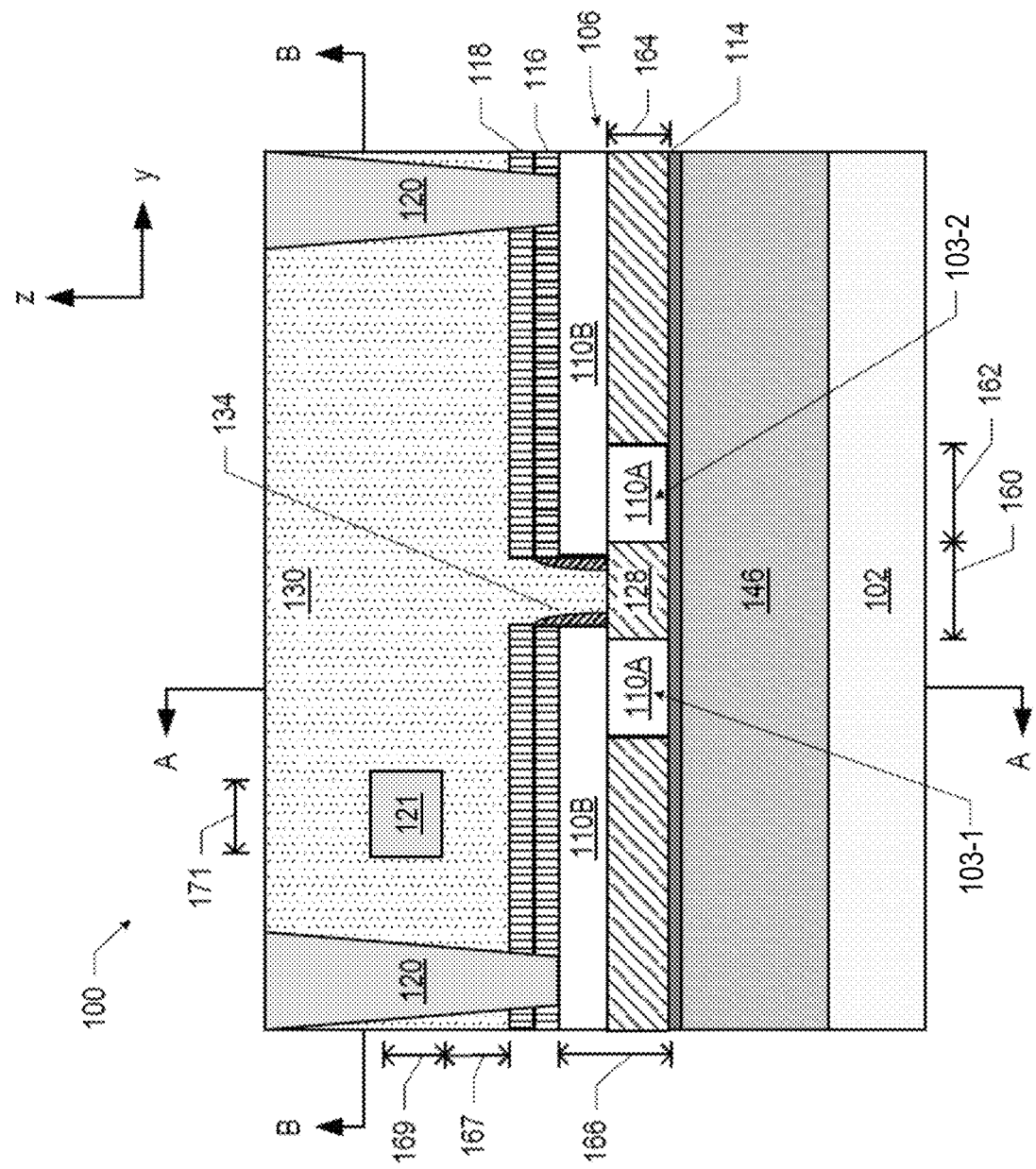
FIGS. 1-4 are cross-sectional views of an example quantum dot device with trenches, in accordance with various embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating quantum dot devices with on-chip microcoil arrangements, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Out of these, quantum dot devices (i.e., devices that rely on formation of quantum dots, e.g., spin qubits) are particularly promising for large-scale qubit implementation.

In general, quantum dot devices enable formation of quantum dots to serve as quantum bits (i.e., as qubits) in a quantum computing device, as well as the control of these quantum dots to perform quantum logic operations. To that end, quantum dot devices implement multiple terminals, such as gate terminals of various types of gates (e.g., barrier gates, plunger gates, and accumulation gates) as well as terminals for making electrical contact with doped regions of a semiconductor material (which may be referred to as "source terminals" and "drain terminals"). DC bias control signals and AC pulses applied to various terminals may be used to control formation of quantum dots in such devices. Single electron transistor (SET) detectors, provided proximate to quantum dot qubits, may then be used to detect states of various qubits. An array of quantum dot qubits (e.g., an array of spin qubits) relies on a gradient magnetic field to ensure that the qubits are separated in frequency in order to be individually addressable. Furthermore, a strong magnetic field gradient is required to electrically drive the electric dipole spin resonance (EDSR) of the qubits. In laboratory settings, lines or planes of magnetic materials provided proximate to quantum dot qubits have been used to generate magnetic fields in a quantum dot device. Inventors of the present disclosure realized that such approaches may not be suitable for large-scale integration of arrays of many quantum dot qubits necessary to make quantum computing commercially feasible. For example, once fabricated, conventional arrangements for providing magnetic fields do not allow for changing the magnetic field, leaving no possibility for adjustment if the targeting is imperfect, posing a challenge to the controllability of the array. Furthermore, requirements on the materials used to realize conventional arrangements for providing magnetic fields are high. Embodiments of the present disclosure provide quantum dot devices and related methods and systems that use microcoil arrangements for providing a gradient magnetic field, the microcoil arrangements integrated on the same chip (e.g., on the same die or wafer) as quantum dot qubits themselves. A microcoil arrangement includes a set of lithographically defined microcoils placed around the array of quantum dot qubits. The coils may include superconducting wires and a ferromagnetic core. The currents through each coil can be individually controlled to in-situ tune the magnetic field and its gradient, helping to ensure a more deterministic addressability, driving, and decoherence of the qubits. Placing the microcoils in Helmholtz-like configurations may allow having a tunable uniform field gradient and field offset. In larger arrays, the field gradient tunability of vertically placed microcoils may allow fine-tuning of qubit frequencies, making re-use of control pulses or multiplexing feasible. Potentially, on-chip microcoil arrangements may eliminate the need for superconducting magnetics in the cryostat, saving costs and making fridge operation easier and safer. Unlike previous approaches to quantum dot formation and manipulation, various embodiments of the quantum dot devices disclosed herein may enable improved control over magnetic fields and their gradients to realize better frequency targeting of individual qubits, help minimize adverse effects of charge noise on qubit decoherence and provide good scalability in the number of quantum dots included in the device.

In various embodiments, quantum dot devices with on-chip microcoil arrangements as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular various gates and conductive vias described herein, as well as other components of quantum circuits such as portions of microcoil arrangements described herein, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 20A-20C, such a collection may be referred to herein without the letters, e.g., as "FIG. 20."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of quantum dot devices with on-chip microcoil arrangements as described herein.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Quantum Dot Formation Regions of Quantum Dot Devices

Quantum dot devices enable formation of quantum dots to serve as quantum bits (i.e., as qubits) in a quantum computing device, as well as formation of quantum dots to serve as a part of one or more SETs for reading/detecting states of said qubits. In some embodiments, quantum dot devices may include rows of quantum dot formation regions—at least one row being a row of a quantum dot formation region where quantum dots for serving as qubits are formed, and at least one other row being a row of a quantum dot formation region where quantum dots for serving as a part of one or more SETs are formed.

In various embodiments, rows of quantum dot formation regions may be formed in different manners. In a first embodiment, a row of a quantum dot formation region may be defined by an insulating material provided over a continuous quantum well stack, the insulating material including a trench corresponding to the row (i.e., multiple trenches if there are multiple rows of quantum dot formation regions), the trench extending toward the continuous quantum well stack, and portions of gate metals of different gates being at least partially in the trench. In such an embodiment, even though the quantum well stack is continuous along a portion of a plane, i.e., continuous in a two-dimensional plane, confinement of the quantum dot formation region to a row (i.e., confinement of the quantum dots formed in a region that is a row), i.e., confinement to substantially one direction, is achieved by the confinement to substantially one direction of the trench in the insulating material, the trench at least partially filled with one or more gate metals. Such embodiments are described below with reference to FIGS. 1-4. In a second embodiment, a row of a quantum dot formation region may be defined by at least a portion of a quantum well stack being formed as a fin corresponding to the row (i.e., multiple fins if there are multiple rows of quantum dot formation regions), and portions of gate metals of different gates being over the fin. In such an embodiment, confinement of the quantum dot formation region to a row is achieved by the confining the quantum well stack to the fin. Thus, in contrast to the second embodiment, at least portions of the quantum well stack may not be horizontally continuous across different fins. Such embodiments are described below with reference to FIGS. 10-12. In various embodiments, the quantum dot devices disclosed herein may provide two-dimensional arrays of quantum dots (e.g., quantum dots 142) during operation, with the quantum dots constrained in "rows" by the quantum dot formation regions (e.g., quantum dot formation regions 111) and "columns" by the gates (e.g., gates 106/108), as discussed below. In some embodiments, individual ones of the gates (e.g., of the gates 106/108) may be shared between multiple quantum dot formation regions. Quantum dot devices that include on-chip microcoil arrangements as described herein may be implemented with said row of quantum dot formation regions defined by either one of these two embodiments.

Example Quantum Dot Devices with Trenches

One type of quantum dot devices includes devices having a base, a continuous quantum well layer extending over the base, an insulating material over the quantum well layer, one or more trenches in the insulating material, and one or more gates with gate metals at least partially disposed in the trenches. A quantum dot formed in such a device may be constrained in the x-direction by the one or more gates, in the y-direction by the trench, and in the z-direction by the quantum well layer, as discussed in detail herein. Unlike previous approaches to quantum dot formation and manipulation, quantum dot devices with trenches provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as a first example quantum dot device in which on-chip microcoil arrangements as described herein may be implemented.

Figure 2:
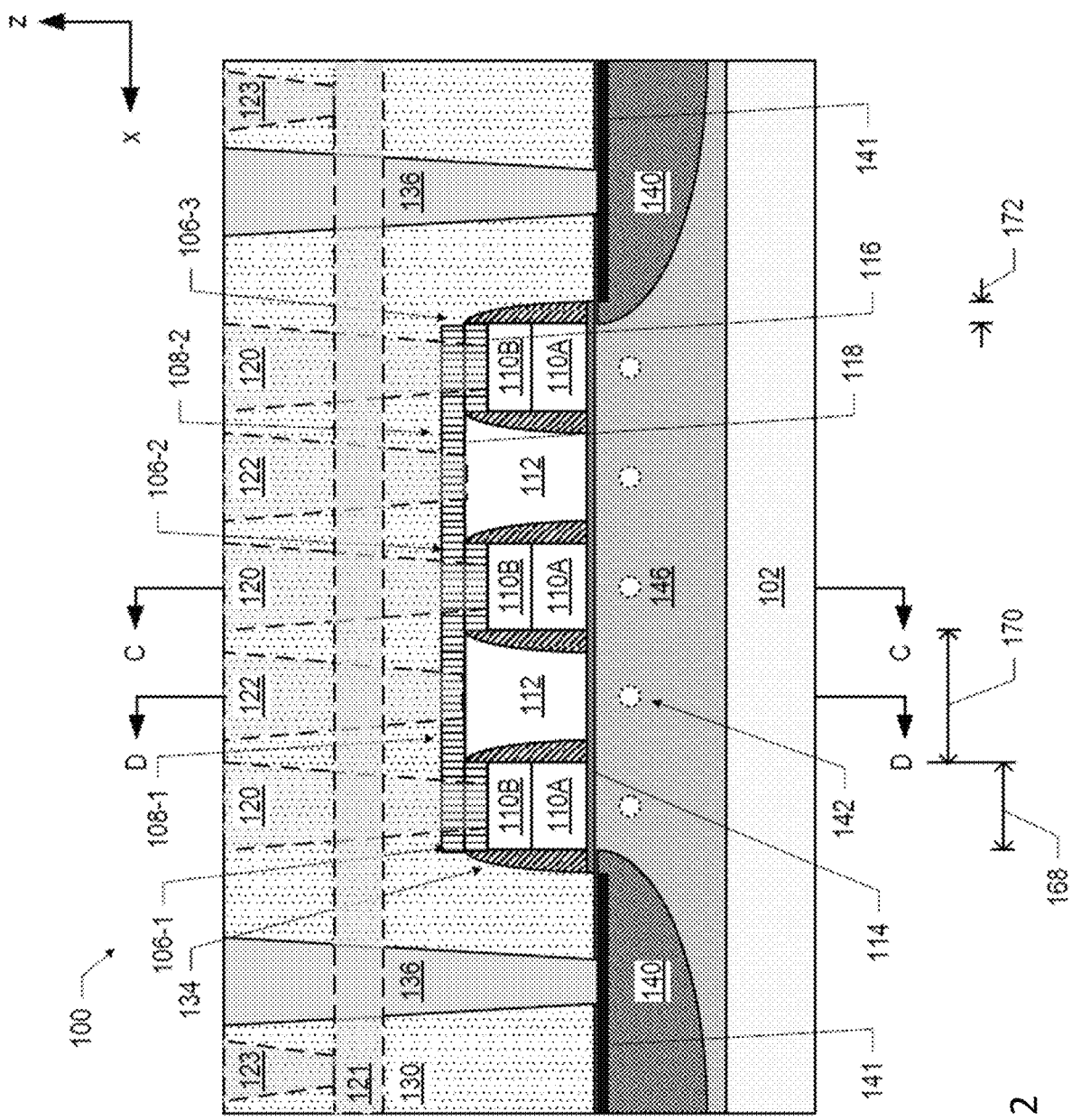
Figure 3:
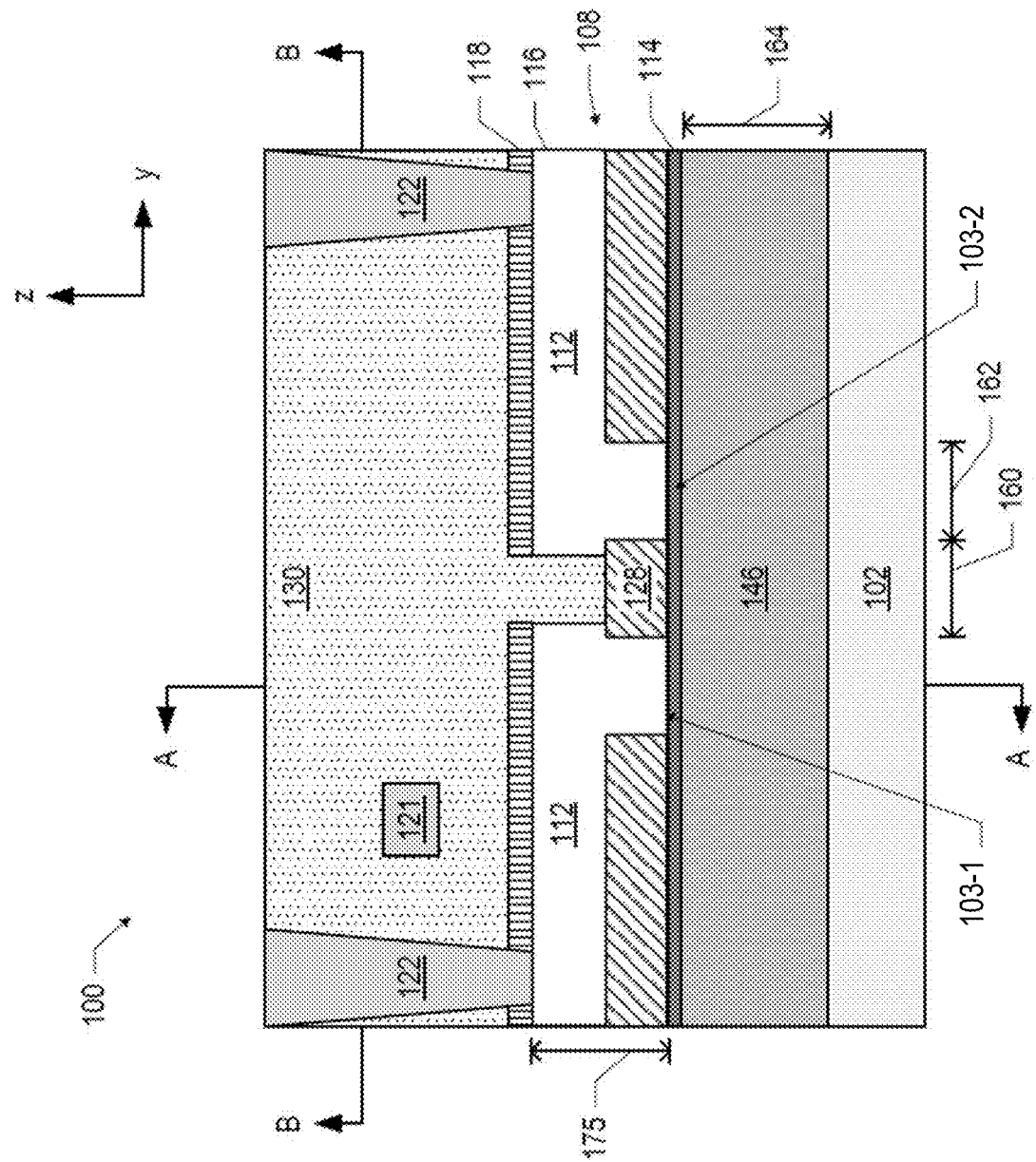
Figure 4:
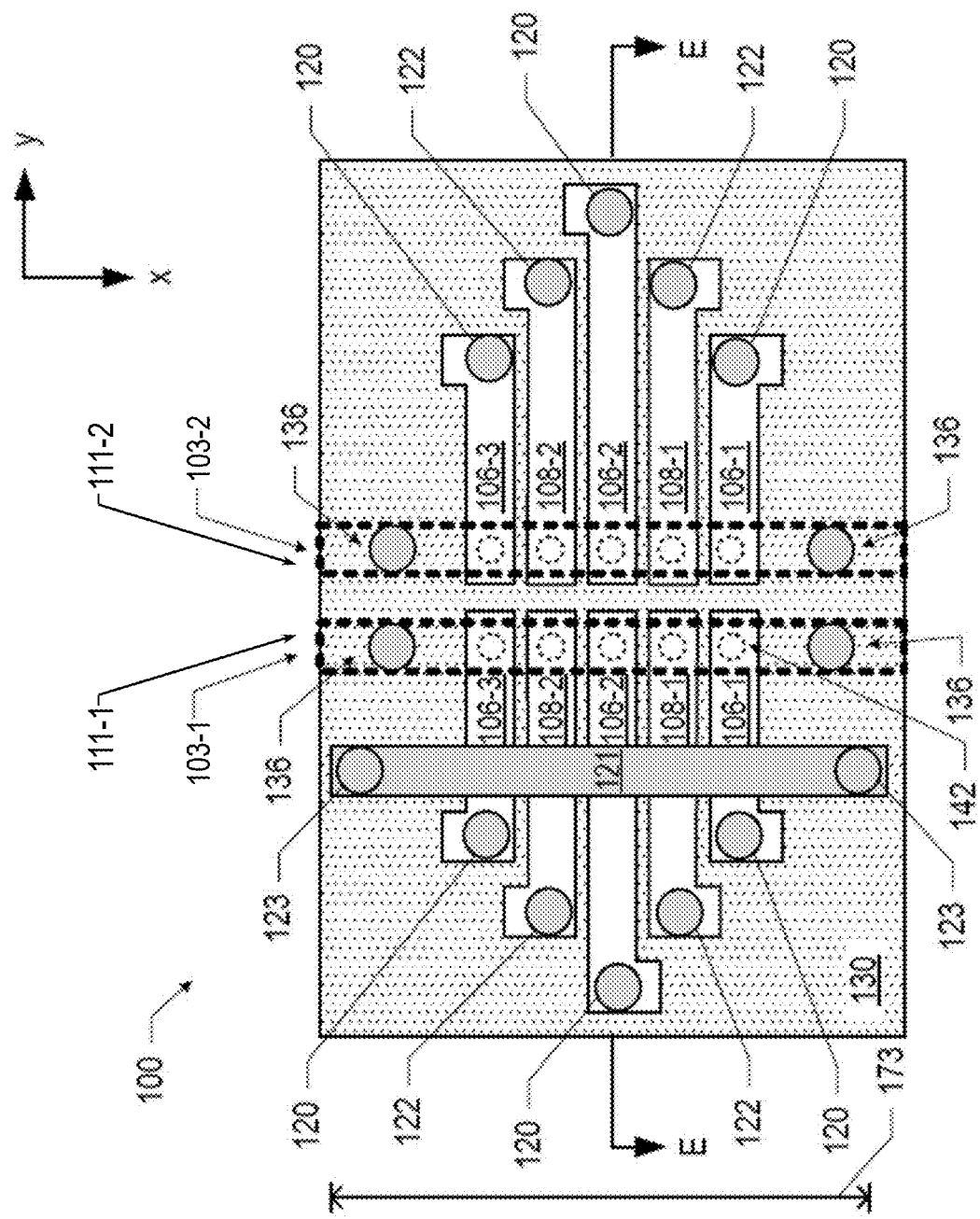

FIGS. 1-4 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), FIG. 3 illustrates the quantum dot device 100 taken along the section D-D of FIG. 2 (while FIG. 2 illustrates the quantum dot device 100 taken along the section A-A of FIG. 3), and FIG. 4 illustrates the quantum dot device 100 taken along the section B-B of FIG. 1 with a number of components not shown to more readily illustrate how the gates 106/108 and the magnet line 121 may be patterned (while FIG. 1 illustrates a quantum dot device 100 taken along the section E-E of FIG. 4). Although FIG. 1 indicates that the cross-section illustrated in FIG. 2 is taken through the trench 103-1, an analogous cross-section taken through the trench 103-2 may be identical, and thus the discussion of FIG. 2 refers generally to the "trench 103."

The quantum dot device 100 may include a quantum well stack 146 disposed on a base 102. An insulating material 128 may be disposed above the quantum well stack 146, and multiple trenches 103 in the insulating material 128 may extend toward the quantum well stack 146. In the embodiment illustrated in FIGS. 1-4, a gate dielectric 114 may be disposed between the quantum well stack 146 and the insulating material 128 so as to provide the "bottom" of the trenches 103. A number of examples of quantum well stacks 146 are discussed below with reference to FIGS. 5-7.

Although only two trenches, 103-1 and 103-2, are shown in FIGS. 1-4, this is simply for ease of illustration, and more than two trenches 103 may be included in the quantum dot device 100. In some embodiments, the total number of trenches 103 included in the quantum dot device 100 is an even number, with the trenches 103 organized into pairs including one active trench 103 and one read trench 103, as discussed in detail below. When the quantum dot device 100 includes more than two trenches 103, the trenches 103 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). As illustrated in FIGS. 1, 3, and 4, in some embodiments, multiple trenches 103 may be oriented substantially in parallel. The discussion herein will largely focus on a single pair of trenches 103 for ease of illustration, but all the teachings of the present disclosure apply to quantum dot devices 100 with more trenches 103.

Further, the use of the term "trench" should not be interpreted to require that the insulating material 128 is deposited first and then a portion of that insulating material 128 is excavated to form the trench 103 prior to depositing material in the trench 103; in various embodiments, the insulating material 128 may be deposited before or after deposition of the material that will ultimately be disposed in the trench 103.

The quantum dot device 100 of FIGS. 1-4 may include multiple quantum dot formation regions 111 (labeled in FIG. 4), defined by the parallel trenches 103 in the insulating material 128 disposed on top of the quantum well stack 146. These quantum dot formation regions 111 may be portions of the quantum well stack 146 in which quantum dots 142 may form during operation. The quantum dot formation regions 111 may be arranged as multiple parallel rows defined by the trenches 103, and the gates 106/108 may each extend over multiple ones of the quantum dot formation regions 111.

The quantum well stack 146 may include a quantum well layer (not shown in FIGS. 1-4, but discussed below with reference to the quantum well layer 152 of FIGS. 5-7). The quantum well layer included in the quantum well stack 146 may be arranged normal to the z-direction, and may provide a layer in which a two-dimensional electron gas (2DEG) may form to enable the generation of one or more quantum dots during operation of the quantum dot device 100, as discussed in further detail below. The quantum well layer itself may provide a geometric constraint on the z-location of quantum dots in the quantum well stack 146. To control the x- and y-location of quantum dots in the quantum well stack 146, voltages may be applied to gates disposed at least partially in the trenches 103 above the quantum well stack 146 to adjust the energy profile along the trenches 103 in the x- and y-direction and thereby constrain the x- and y-location of quantum dots within quantum wells (discussed in detail below with reference to the gates 106/108). The dimensions of the trenches 103 may take any suitable values. For example, in some embodiments, the trenches 103 may each have a width 162 between about 5 nanometers and 30 nanometers. In some embodiments, the trenches 103 may each have a depth 164 between about 40 nanometers and 400 nanometers (e.g., between about 70 nanometers and 350 nanometers, or equal to about 300 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 103 may be spaced apart by a distance 160 between about 50 nanometers and 500 nanometers.

Figure 22A:
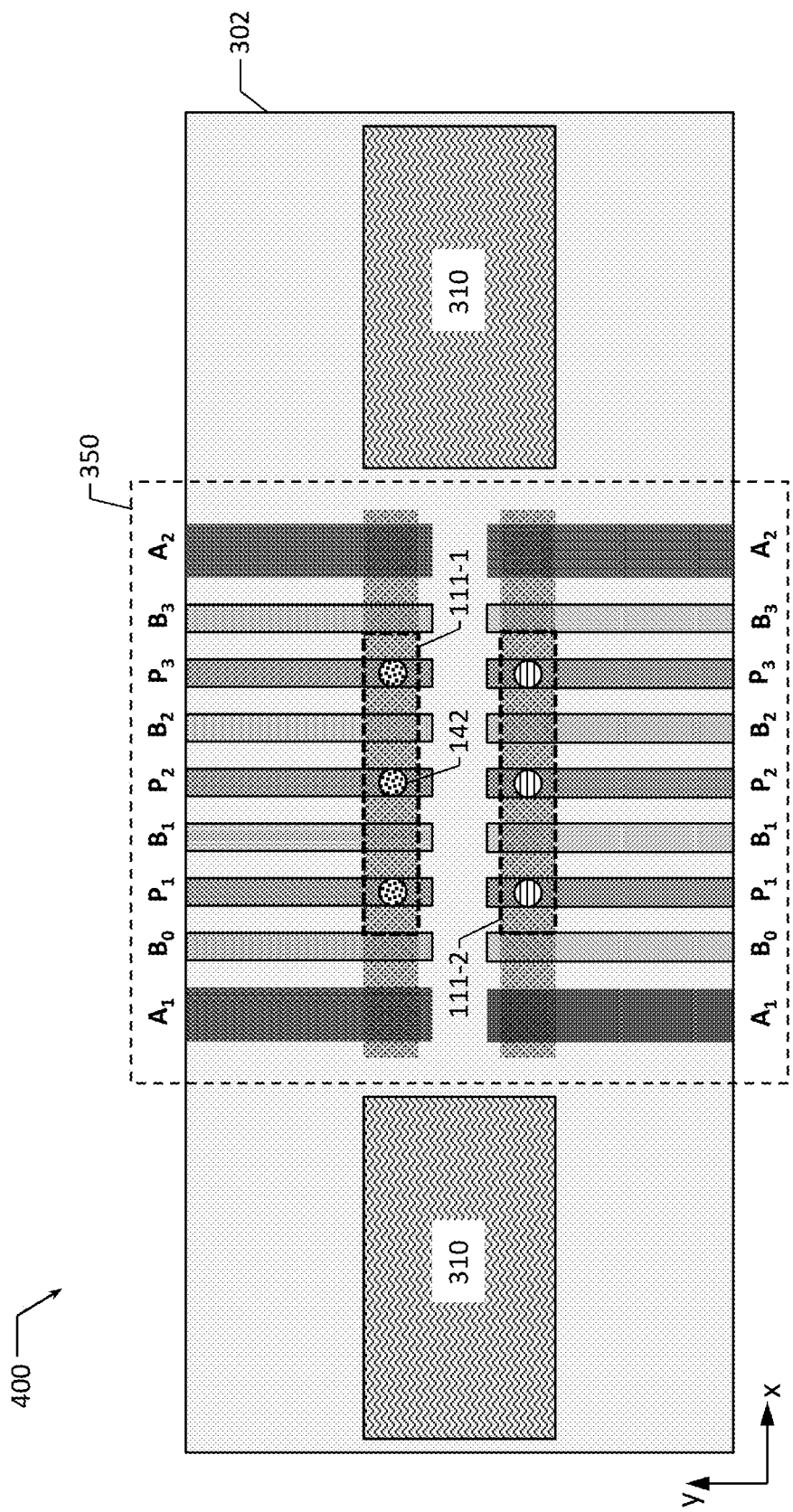
FIGS. 22A-22D are different cross-sectional views of a portion of an example quantum dot device with an arrangement of gates and on-chip microcoil arrangements, in accordance with some embodiments.
Figure 22B:
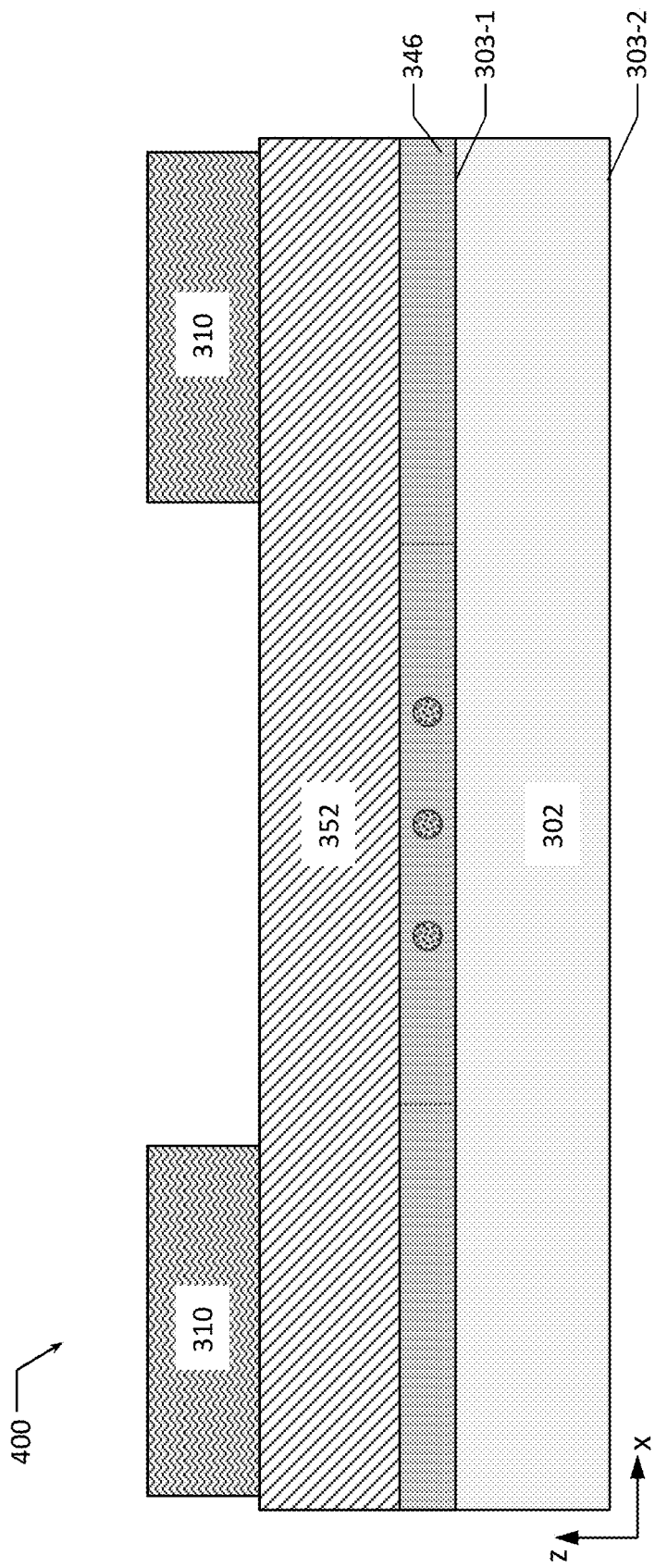
Figure 22C:
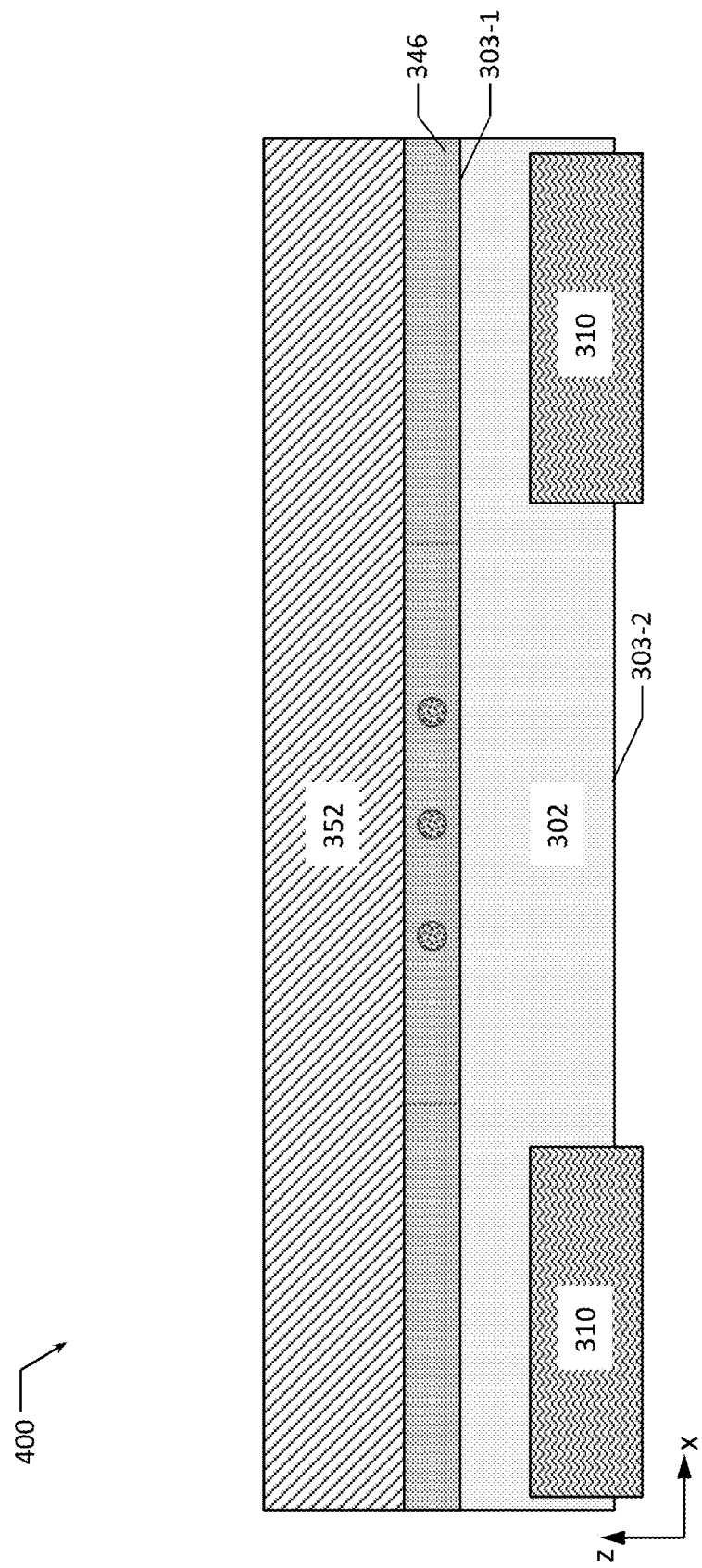

Multiple gates may be disposed at least partially in each of the trenches 103. In the embodiment illustrated in FIG. 2, three gates 106 and two gates 108 are shown as distributed at least partially in a single trench 103. This particular number of gates is simply illustrative, and any suitable number of gates may be used (e.g., FIG. 22 and FIG. 23, showing various embodiments of quantum dot devices with on-chip microcoil arrangements, illustrate more than a total of five gates). Additionally, in some embodiments, multiple groups of gates (like the gates illustrated in FIG. 2) may be disposed at least partially in the trench 103.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114 (i.e., the gate dielectric 114 may not be continuous across multiple ones of the gates 106/108). In some embodiments, the gate dielectric 114 may be a multilayer gate dielectric (e.g., with multiple materials used to improve the interface between the trench 103 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 (including multiple layers of gate metal) and a hardmask 116. In particular, a first gate metal layer 110A may be disposed in the trench 103, and a second gate metal layer 110B may be disposed above the gate metal 110-1 and above the insulating material 128, as shown. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 1, in some embodiments, the gate metal 110 of a gate 106 may extend over the insulating material 128 and into a trench 103 in the insulating material 128. Only one portion of the hardmask 116 is labeled in FIG. 2 for ease of illustration.

In some embodiments, the gate metal 110 may be a superconductor, such as aluminum, titanium nitride, or niobium titanium nitride; any of these materials may be included in the first gate metal layer 110A and/or the second gate metal layer 110B. In some embodiments, the first gate metal layer 110A may have a different material composition than the second gate metal layer 110B. For example, the first gate metal layer 110A may be titanium nitride, while the second gate metal layer 110B may be a material different from titanium nitride, or vice versa. In some embodiments, the first gate metal layer 110A and the second gate metal layer 110B may have the same material composition but a different microstructure. These different microstructures may arise, for example, by different deposition and/or patterning techniques used to form the first gate metal layer 110A and the second gate metal layer 110B. For example, in some embodiments, the first gate metal layer 110A may have a microstructure including columnar grains (e.g., when the first gate metal layer 110A is initially blanket-deposited and then etched as part of a subtractive patterning process), while the second gate metal layer 110B may not exhibit a columnar grain structure. In some embodiments, a seam delineating the interface between the top surface of the first gate metal layer 110A and the bottom surface of the second gate metal layer 110B may be present in the quantum dot device 100.

In some embodiments, the hardmask 116 may not be present in the quantum dot device 100 (e.g., a hardmask like the hardmask 116 may be removed during processing). The sides of the gate metal 110 may be substantially parallel, as shown in FIG. 2, and insulating spacers 134 may be disposed on the sides of the gate metal 110 and the hardmask 116 along the longitudinal axis of the trench 103. As illustrated in FIG. 2, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). As illustrated in FIG. 1, no spacer material may be disposed between the gate metal 110 and the sidewalls of the trench 103 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 3, in some embodiments, the gate metal 112 of a gate 108 may extend over the insulating material 128 and into a trench 103 in the insulating material 128. In the embodiment illustrated in FIG. 2, the hardmask 118 may extend over the hardmask 116 (and over the gate metal 110 of the gates 106), while in other embodiments, the hardmask 118 may not extend over the gate metal 110. In the embodiment of FIGS. 1-3, the gate metal 112 of the gates 108 may be provided by a single continuous layer of material (and may not, for example, include multiple different layers of gate metal, as was discussed above with reference to the gate metal 110 of the gates 106). In other embodiments, however, the gate metal 112 of the gates 108 may include multiple layers of gate metal, e.g., multiple layers similar to the first gate metal layer 110A and the second gate metal layer 110B. In some embodiments, the gate metal 112 may be a different metal from the first gate metal layer 110A and/or the second gate metal layer 110B; in other embodiments, the gate metal 112 and the first gate metal layer 110A and/or the second gate metal layer 110B may have the same material composition. In some embodiments, the gate metal 112 may be a superconductor, such as aluminum, titanium nitride, or niobium titanium nitride. In some embodiments, the hardmask 118 may not be present in the quantum dot device 100 (e.g., a hardmask like the hardmask 118 may be removed during processing).

The gate 108-1 may extend between the proximate spacers 134 on the sides of the gate 106-1 and the gate 106-2 along the longitudinal axis of the trench 103, as shown in FIG. 2. In some embodiments, the gate metal 112 of the gate 108-1 may extend between the spacers 134 on the sides of the gate 106-1 and the gate 106-2 along the longitudinal axis of the trench 103. Thus, the gate metal 112 of the gate 108-1 may have a shape that is substantially complementary to the shape of the spacers 134, as shown in FIG. 2. Similarly, the gate 108-2 may extend between the proximate spacers 134 on the sides of the gate 106-2 and the gate 106-3 along the longitudinal axis of the trench 103. In some embodiments in which the gate dielectric 114 is not a layer shared commonly between the gates 108 and 106, but instead is separately deposited in the trench 103 between the spacers 134, the gate dielectric 114 may extend at least partially up the sides of the spacers 134 (and up the proximate sidewalls of the trench 103), and the gate metal 112 may extend between the portions of gate dielectric 114 on the spacers 134 (and the proximate sidewalls of the trench 103). As illustrated in FIG. 3, in some embodiments, no spacer material may be disposed between the gate metal 112 and the sidewalls of the trench 103 in the y-direction; in other embodiments (not shown in the present drawings), spacers 134 may also be disposed between the gate metal 112 and the sidewalls of the trench 103 in the y-direction.

The dimensions of the gates 106/108 may take any suitable values. For example, in some embodiments, the z-height 166 of the gate metal 110 in the trench 103 may be between about 225 nanometers and 375 nanometers (e.g., approximately about 300 nanometers); the z-height 175 of the gate metal 112 may be in about the same range. This z-height 166 of the gate metal 110 in the trench 103 may represent the sum of the z-height of the first gate metal layer 110A (e.g., between about 40 nanometers and 300 nanometers) and the thickness of the second gate metal layer 110B (e.g., between about 25 nanometers and 75 nanometers, or approximately 50 nanometers). In embodiments like the ones illustrated in FIGS. 1-3, the z-height 175 of the gate metal 112 may be greater than the z-height 166 of the gate metal 110 (as can be seen in, e.g., FIG. 2). In some embodiments, the length 168 of the gate metal 110 (i.e., in the x-direction) may be between about 20 nanometers and 40 nanometers (e.g., about 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between about 40 nanometers and 60 nanometers (e.g., about 50 nanometers). In some embodiments, the thickness 172 of the spacers 134 may be between about 1 nanometer and 10 nanometers (e.g., between about 3 nanometers and 5 nanometers, between about 4 nanometers and 6 nanometers, or between about 4 nanometers and 7 nanometers). The length of the gate metal 112 (i.e., in the x-direction) may depend on the dimensions of the gates 106 and the spacers 134, as illustrated in FIG. 2. As indicated in FIGS. 1 and 3, the gates 106/108 in one trench 103 may extend over the insulating material 128 between that trench 103 and an adjacent trench 103, but may be isolated from their counterpart gates by the intervening insulating material 130 and spacers 134.

As shown in FIG. 2, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form. Only one quantum dot 142 is labeled with a reference numeral in FIGS. 2 and 4 for ease of illustration, but five are indicated as dotted circles below each trench 103. The location of the quantum dots 142 in FIGS. 2 and 4 is not intended to indicate a particular geometric positioning of the quantum dots 142. The spacers 134 (and the insulating material 128) may themselves provide "passive" barriers between quantum dots under the gates 106/108 in the quantum well stack 146, and the voltages applied to different ones of the gates 106/108 may adjust the potential energy under the gates 106/108 in the quantum well stack 146; decreasing the potential energy under a gate 106/108 may enable the formation of a quantum dot under that gate 106/108, while increasing the potential energy under a gate 106/108 may form a quantum barrier under that gate 106/108.

The quantum well stack 146 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide. In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well stack 146 under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-4, the gates 106 may extend both "vertically" and "horizontally" away from the quantum well stack 146, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140 and through a quantum well layer of the quantum well stack 146 (discussed in further detail below with reference to FIGS. 5-7). When the doped regions 140 are doped with an n-type material, this voltage may be positive; when the doped regions 140 are doped with a p-type material, this voltage may be negative. The magnitude of this bias voltage may take any suitable value (e.g., between about 0.25 volts and 2 volts).

In some embodiments, the quantum dot device 100 may include one or more magnet lines 121. For example, a single magnet line 121 is illustrated in FIGS. 1-4, proximate to the trench 103-1. The magnet line 121 may be formed of a conductive material and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-4 is non-coplanar with the trenches 103, and is also non-coplanar with the gates 106/108. In some embodiments, the magnet line 121 may be spaced apart from the gates 106/108, in the direction of the z-axis of the example coordinate system shown, by a distance 167. The distance 167 may take any suitable value (e.g., based on the desired strength of magnetic field interaction with particular quantum dots 142); in some embodiments, the distance 167 may be between about 25 nanometers and 1 micron (e.g., between about 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between about 25 nanometers and 100 nanometers. The magnet line 121 may have a width 171 between about 25 nanometers and 100 nanometers. In some embodiments, the width 171 and thickness 169 of a magnet line 121 may be substantially equal to, respectively, the width and thickness of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-4 is substantially linear, but this need not be the case; in general, the magnet lines 121 of the quantum dot devices 100 may take any suitable shape. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of IC manufacturing, conductive vias and lines may be formed in an iterative process in which layers of structures are formed on top of each other. In some embodiments, the conductive vias 120/122/136/123 may have a width that is about 20 nanometers or greater at their widest point (e.g., about 30 nanometers), and a pitch of about 80 nanometers or greater (e.g., about 100 nanometers). In some embodiments, conductive lines (not shown) included in the quantum dot device 100 may have a width that is about 100 nanometers or greater, and a pitch of about 100 nanometers or greater. The particular arrangement of conductive vias shown in FIGS. 1-4 is simply illustrative, and any electrical routing arrangement may be implemented.

As discussed above, the structure of the trench 103-1 may be the same as the structure of the trench 103-2; similarly, the construction of gates 106/108 in and around the trench 103-1 may be the same as the construction of gates 106/108 in and around the trench 103-2. The gates 106/108 associated with the trench 103-1 may be mirrored by corresponding gates 106/108 associated with the parallel trench 103-2, and the insulating material 130 may separate the gates 106/108 associated with the different trenches 103-1 and 103-2. In particular, quantum dots 142 formed in the quantum well stack 146 under the trench 103-1 (under the gates 106/108) may have counterpart quantum dots 142 in the quantum well stack 146 under the trench 103-2 (under the corresponding gates 106/108). In some embodiments, the quantum dots 142 under the trench 103-1 may be used as "active" quantum dots in the sense that these quantum dots 142 act as qubits and are controlled (e.g., by voltages applied to the gates 106/108 associated with the trench 103-1) to perform quantum computations. The quantum dots 142 associated with the trench 103-2 may be used as "read" quantum dots in the sense that these quantum dots 142 may sense the quantum state of the quantum dots 142 under the trench 103-1 by detecting the electric field generated by the charge in the quantum dots 142 under the trench 103-1, and may convert the quantum state of the quantum dots 142 under the trench 103-1 into electrical signals that may be detected by the gates 106/108 associated with the trench 103-2. Each quantum dot 142 under the trench 103-1 may be read by its corresponding quantum dot 142 under the trench 103-2. Thus, the quantum dot device 100 enables both quantum computation and the ability to read the results of a quantum computation.

As discussed above, the quantum well stack 146 may include a quantum well layer in which a 2DEG may form during operation of the quantum dot device 100. The quantum well stack 146 may take any of a number of forms, several of which are illustrated in FIGS. 5-7. The various layers in the quantum well stacks 146 discussed below may be grown on the base 102 (e.g., using epitaxial processes).

Although the singular term "layer" may be used to refer to various components of the quantum well stacks 146 of FIGS. 5-7, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 5:
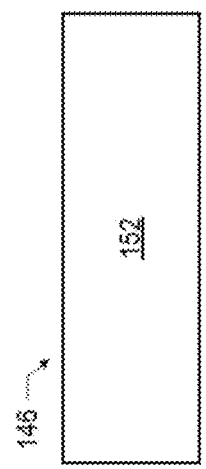
FIGS. 5-7 are cross-sectional views of various examples of quantum well stacks that may be used in a quantum dot device with either trenches or fins, in accordance with various embodiments.

FIG. 5 is a cross-sectional view of a quantum well stack 146 including only a quantum well layer 152. The quantum well layer 152 may be disposed on the base 102, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 5 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 5 is formed of intrinsic silicon may be particularly advantageous for electron-type quantum dot devices 100. In some embodiments, the quantum well layer 152 of FIG. 5 may be formed of intrinsic germanium, and the gate dielectric 114 may be formed of germanium oxide; in such an arrangement, during use of the quantum dot device 100, a 2D hole gas (2DHG) may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 5 may take any suitable values. For example, in some embodiments, the thickness of the quantum well layer 152 (e.g., intrinsic silicon or germanium) may be between about 0.8 microns and 1.2 microns.

Figure 6:
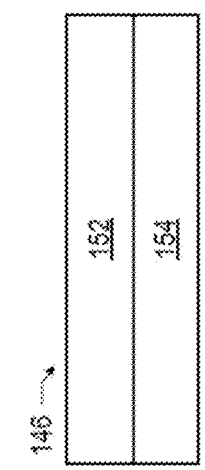

FIG. 6 is a cross-sectional view of a quantum well stack 146 including a quantum well layer 152 and a barrier layer 154. The quantum well stack 146 may be disposed on the base 102 (e.g., as discussed above with reference to FIG. 6) such that the barrier layer 154 is disposed between the quantum well layer 152 and the base 102. The barrier layer 154 may provide a potential barrier between the quantum well layer 152 and the base 102. As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 6 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 6 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 7:
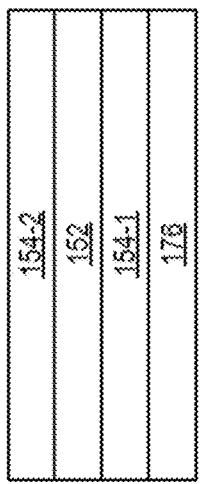

FIG. 7 is a cross-sectional view of a quantum well stack 146 including a quantum well layer 152 and a barrier layer 154-1, as well as a buffer layer 176 and an additional barrier layer 154-2. The quantum well stack 146 may be disposed on the base 102 such that the buffer layer 176 is disposed between the barrier layer 154-1 and the base 102. The buffer layer 176 may be formed of the same material as the barrier layer 154, and may be present to trap defects that form in this material as it is grown on the base 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. The thicknesses (i.e., z-heights) of the layers in the quantum well stack 146 of FIG. 7 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 6, the quantum well layer 152 of FIG. 52 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 7 may be formed of silicon, and the barrier layer 154-1 and the buffer layer 176 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 7 may be formed of germanium, and the buffer layer 176 and the barrier layer 154-1 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the base 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 7, the buffer layer 176 and/or the barrier layer 154-2 may be omitted.

Figure 8:
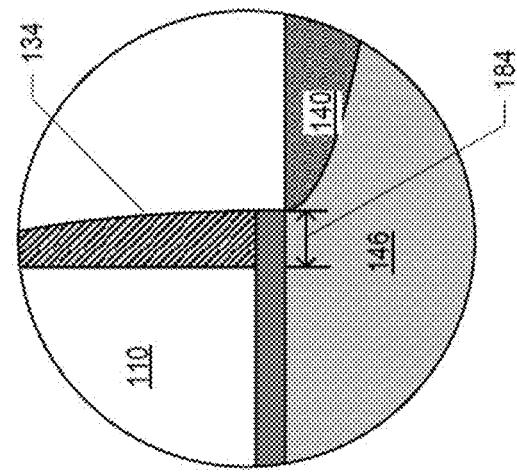
FIGS. 8-9 illustrate detail views of various embodiments of a doped region in a quantum dot device with either trenches or fins, in accordance with various embodiments.
Figure 9:
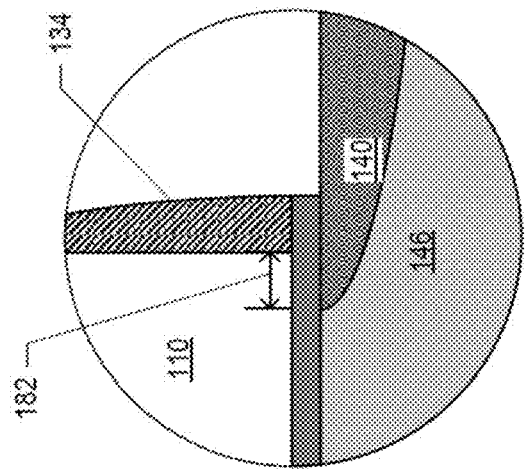

The outer spacers 134 on the outer gates 106, shown, e.g., in FIG. 2, may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 8, the doped region 140 may extend past the outer spacers 134 and under the outer gates 106 by a distance 182 between about 0 nanometers and 10 nanometers. In some embodiments, the doped regions 140 may not extend past the outer spacers 134 toward the outer gates 106, but may instead "terminate" under the outer spacers 134. For example, as illustrated in FIG. 9, the doped regions 140 may be spaced away from the interface between the outer spacers 134 and the outer gates 106 by a distance 184 between about 0 nanometers and 10 nanometers. The interface material 141 is omitted from FIGS. 8 and 9 for ease of illustration.

Example Quantum Dot Devices with Fins

Another type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Similar to the quantum dot devices with trenches, described above, and unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as another example quantum dot device in which on-chip microcoil arrangements as described herein may be implemented.

Figure 10:
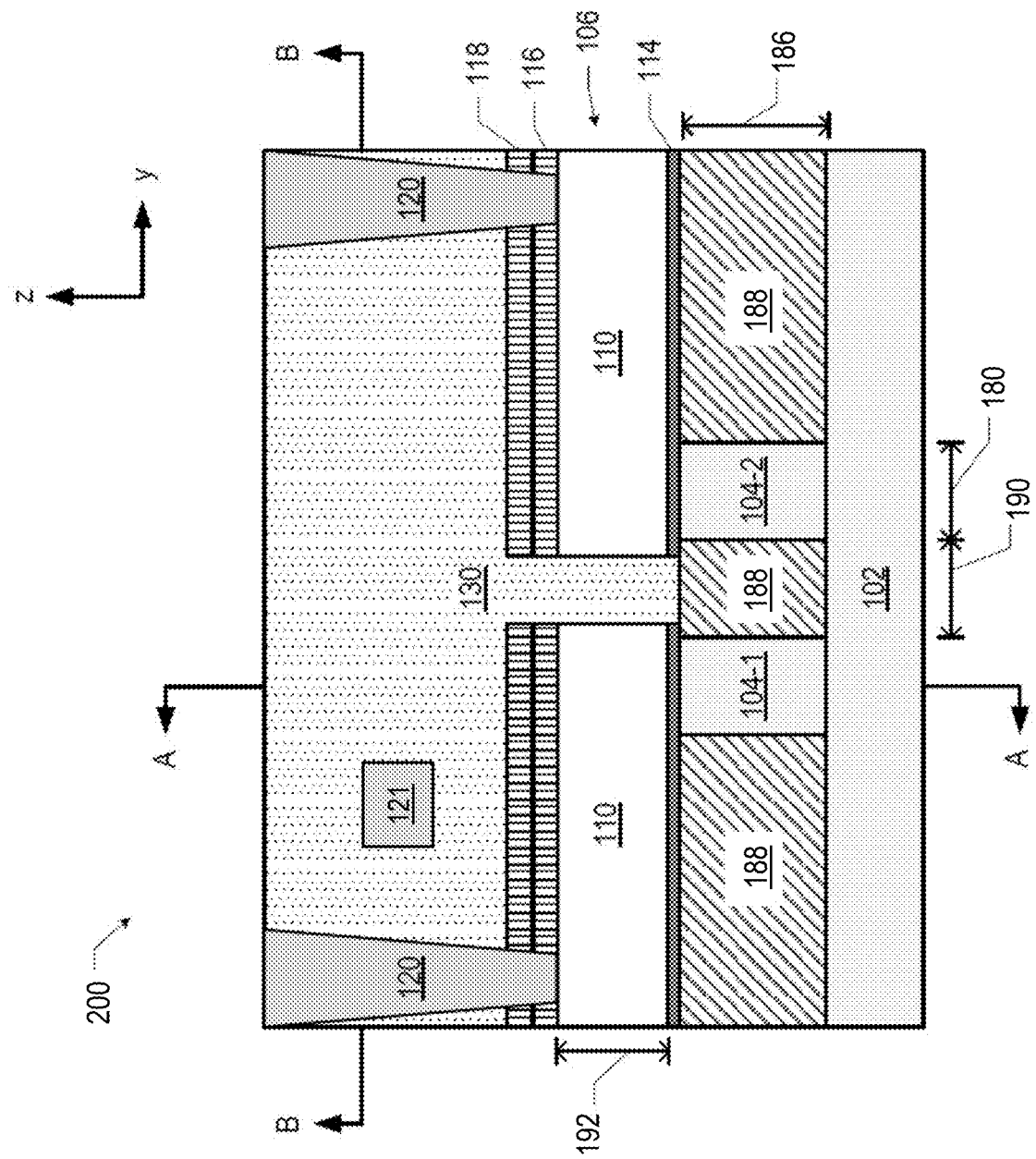
FIGS. 10-12 are cross-sectional and top-down views of an example quantum dot device with fins, according to some embodiments of the present disclosure.
Figure 11:
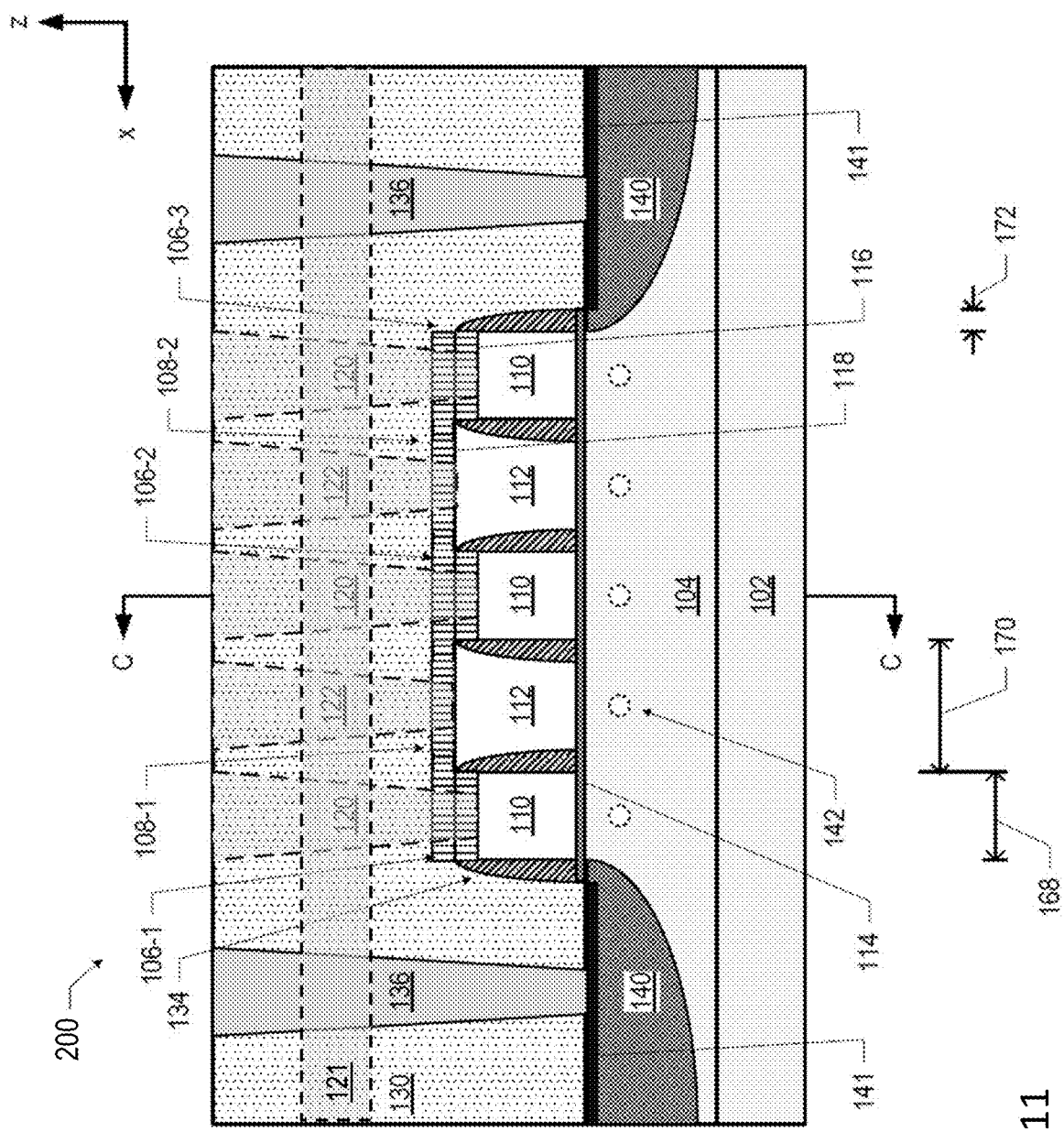
Figure 12:
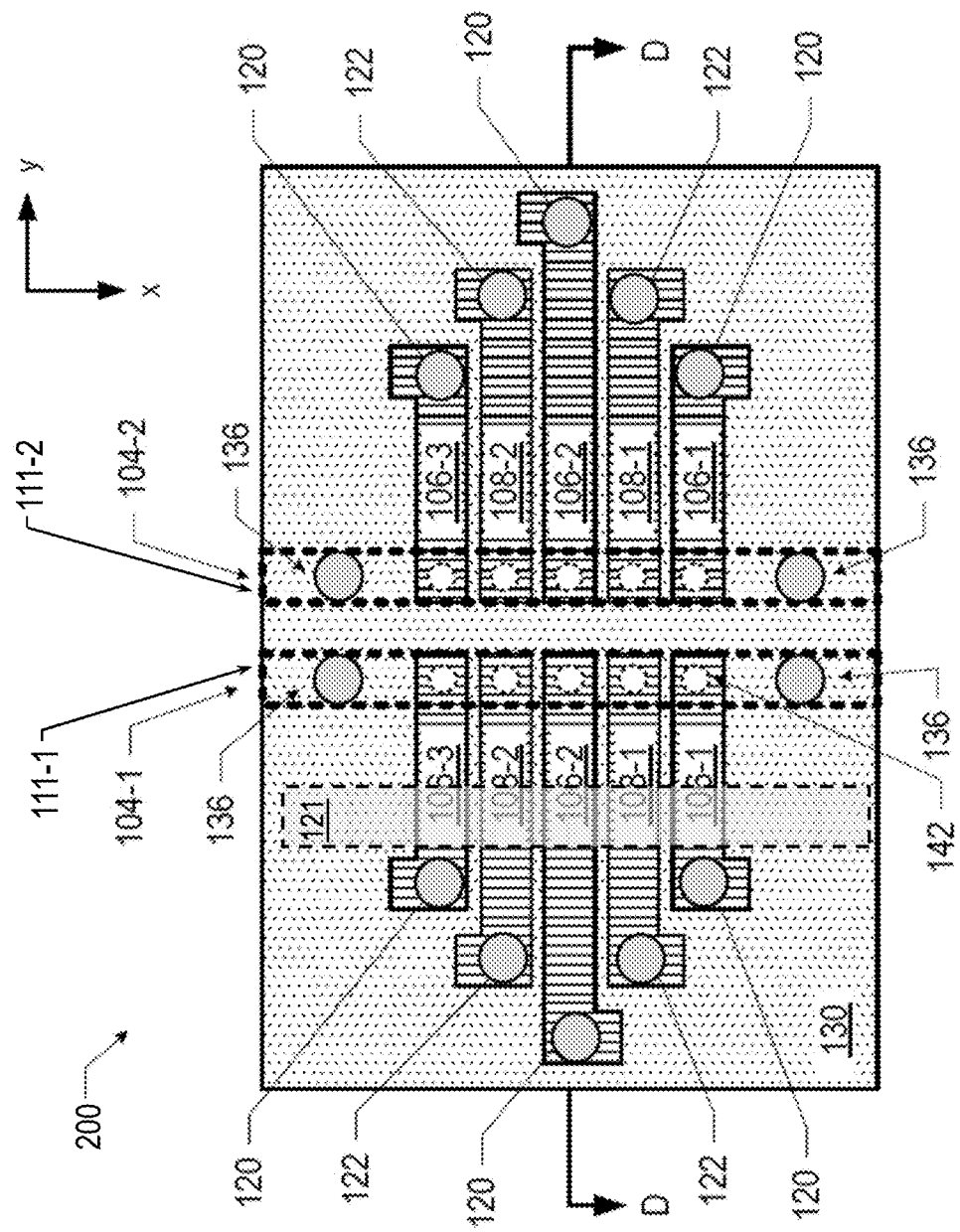

FIGS. 10-12 are cross-sectional views of an example quantum dot device 200 implementing quantum dot qubits, in accordance with various embodiments. In particular, FIG. 11 illustrates the quantum dot device 200 taken along the section A-A of FIG. 10 (while FIG. 10 illustrates the quantum dot device 200 taken along the section C-C of FIG. 11), and FIG. 12 illustrates the quantum dot device 200 taken along the section B-B of FIG. 10 (while FIG. 10 illustrates a quantum dot device 200 taken along the section D-D of FIG. 12). Although FIG. 10 indicates that the cross-section illustrated in FIG. 11 is taken through the fin 104-1, an analogous cross-section taken through the fin 104-2 may be identical, and thus the discussion of FIGS. 10-12 refers generally to the "fin 104."

As shown in FIGS. 10-12, the quantum dot device 200 may include a base 102, similar to the base 102 of the quantum dot device 200 shown in FIGS. 1-4, and multiple fins 104 extending away from the base 102. The base 102 and the fins 104 may include a semiconductor substrate and a quantum well stack (not shown in FIGS. 10-12, but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer, e.g., a quantum well layer as discussed above with reference to the quantum well layer 152 of FIGS. 5-7. Examples of base/fin arrangements are discussed below with reference to the base fin arrangements 158 of FIGS. 13-19.

Although only two fins, 104-1 and 104-2, are shown in FIGS. 10-12, this is simply for ease of illustration, and more than two fins 104 may be included in the quantum dot device 200. In some embodiments, the total number of fins 104 included in the quantum dot device 200 is an even number, with the fins 104 organized into pairs including one active fin 104 and one read fin 104, as discussed in detail below. When the quantum dot device 200 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). As illustrated in FIGS. 10 and 12, in some embodiments, multiple fins 104 may be oriented substantially in parallel. The discussion herein will largely focus on a single pair of fins 104 for ease of illustration, but all the teachings of the present disclosure apply to quantum dot devices 200 with more fins 104.

The quantum dot device 200 of FIGS. 10-12 may include multiple quantum dot formation regions 111 (labeled in FIG. 12), defined by the fins 104. These quantum dot formation regions 111 may be portions of the quantum well stack 146 in which quantum dots 142 may form during operation. The quantum dot formation regions 111 may be arranged as multiple parallel rows defined by the insulating material 188, and the gates 106/108 may each extend over multiple ones of the quantum dot formation regions 111. In the embodiments discussed with reference to FIGS. 10-12, the quantum dot formation regions 111 may be defined by fins 104 separated by portions of insulating material 188; these fins 104 may provide parallel rows of portions of quantum well layers 152 in which quantum dots 142 may form. Thus, the quantum dot formation regions 111 of the quantum dot device 200 of FIGS. 10-12 and of the quantum dot device 100 of FIGS. 1-4 illustrate two different ways of defining the quantum dot formation regions 111.

As noted above, each of the fins 104 may include a quantum well layer (not shown in FIGS. 10-12, but discussed above with reference to the quantum well layer 152). The quantum well layer included in the fins 104 may be arranged normal to the z-direction, and may provide a layer in which a 2DEG may form to enable the generation of a quantum dot during operation of the quantum dot device 200, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 180 between about 10 and 30 nanometers. In some embodiments, the fins 104 may each have a height 186 between about 200 and 400 nanometers (e.g., between about 250 and 350 nanometers, or equal to about 300 nanometers).

The fins 104 may be arranged in parallel, as illustrated in FIGS. 10 and 12, and may be spaced apart by an insulating material 188, which may be disposed on opposite faces of the fins 104. The insulating material 188 may be of the quantum dot device 200 may be a dielectric material, such as silicon oxide, similar to the insulating material 128 of the quantum dot device 100. For example, in some embodiments, the fins 104 may be spaced apart by a distance 190 between about 100 and 250 microns.

Multiple gates may be disposed on each of the fins 104. In the embodiment illustrated in FIG. 11, three gates 106 and two gates 108 are shown as distributed on the top of the fin 104. This particular number of gates is simply illustrative, and any suitable number of gates may be used. Additionally, multiple groups of gates like the gates illustrated in FIG. 11 may be disposed on the fin 104.

Similar to the quantum dot device 100, in the quantum dot device 200, as shown in FIG. 11, the gate 108-1 may be disposed between the gates 106-1 and 106-2, and the gate 108-2 may be disposed between the gates 106-2 and 106-3, and each of the gates 106/108 may include a gate dielectric 114. In the embodiment illustrated in FIG. 11, the gate dielectric 114 for all of the gates 106/108 is provided by a common layer of gate dielectric material. In other embodiments, the gate dielectric 114 for each of the gates 106/108 of the quantum dot device 200 may be provided by separate portions of gate dielectric 114. Descriptions provided with respect to materials of the gate dielectric 114 of the quantum dot device 100 are applicable to the gate dielectric 114 of the quantum dot device 200 and, therefore, are not repeated.

In the quantum dot device 200, each of the gates 106 may include a gate metal 110 and a hardmask 116, similar to those of the quantum dot device 100. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 11 for ease of illustration. In some embodiments, the hardmask 116 may not be present in the quantum dot device 200 (e.g., a hardmask like the hardmask 116 may be removed during processing). In the quantum dot device 200, the sides of the gate metal 110 may be substantially parallel, as shown in FIG. 11, and insulating spacers 134 may be disposed on the sides of the gate metal 110 and the hardmask 116, similar to the insulating spacers 134 of the quantum dot device 100. As illustrated in FIG. 11, the spacers 134 may be thicker closer to the fin 104 and thinner farther away from the fin 104. In some embodiments, the spacers 134 may have a convex shape. Descriptions provided with respect to materials of the gate metal 110, the hardmask 116, and the spacers 134 of the quantum dot device 100 are applicable to those of the quantum dot device 200 and, therefore, are not repeated.

In the quantum dot device 200, each of the gates 108 may include a gate metal 112 and a hardmask 118, similar to those of the quantum dot device 100. The gate metal 112 may be disposed between the hardmask 118 and the gate dielectric 114, and the gate dielectric 114 may be disposed between the gate metal 112 and the fin 104. In the embodiment illustrated in FIG. 11, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the hardmask 118 may not be present in the quantum dot device 200 (e.g., a hardmask like the hardmask 118 may be removed during processing). Descriptions provided with respect to materials of the gate metal 112 and the hardmask 118 of the quantum dot device 100 are applicable to those of the quantum dot device 200 and, therefore, are not repeated.

The gate 108-1 may extend between the proximate spacers 134 on the sides of the gate 106-1 and the gate 106-2 along the longitudinal axis of the fin 104, as shown in FIG. 11. In some embodiments, the gate metal 112 of the gate 108-1 may extend between the spacers 134 on the sides of the gate 106-1 and the gate 106-2 along the longitudinal axis of the fin 104. Thus, the gate metal 112 may have a shape that is substantially complementary to the shape of the spacers 134, as shown in FIG. 11. Similarly, the gate 108-2 may extend between the proximate spacers 134 on the sides of the gate 106-2 and the gate 106-3 along the longitudinal axis of the fin 104. In some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 in the quantum dot device 200 may take any suitable values. For example, in some embodiments, the z-height 192 of the gate metal 110 may be between about 40 and 75 nanometers (e.g., approximately about 50 nanometers); the z-height of the gate metal 112 may be in the same range. In embodiments like the ones illustrated in FIG. 11, the z-height of the gate metal 112 may be greater than the z-height of the gate metal 110. In some embodiments, the length 168 of the gate metal 110 (i.e., in the x-direction) in the quantum dot device 200 may be substantially the same as in the quantum dot device 100, e.g., between about 20 and 40 nanometers (e.g., about 30 nanometers). In some embodiments, the distance 170 and/or the thickness 172 shown for the quantum dot device 200 of FIG. 11 may be substantially the same as those shown for the quantum dot device 100 of FIG. 2. The length of the gate metal 112 (i.e., in the x-direction) may depend on the dimensions of the gates 106 and the spacers 134, as illustrated in FIG. 11. As indicated in FIG. 10, the gates 106/108 on one fin 104 may extend over the insulating material 188 beyond their respective fins 104 and towards the other fin 104, but may be isolated from their counterpart gates by the intervening insulating material 130.

In the embodiment of the quantum dot device 200 illustrated in FIG. 11, the z-height of the gate metal 112 of the gates 108 may be approximately equal to the sum of the z-height of the gate metal 110 and the z-height of the hardmask 116, as shown. Also in the embodiment of FIG. 11, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

As shown in FIG. 11, the gates 106 and 108 may be alternatingly arranged along the fin 104 in the x-direction. During operation of the quantum dot device 200, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 11 and 12 for ease of illustration, but five are indicated as dotted circles in each fin 104, forming what may be referred to as a "quantum dot array." The location of the quantum dots 142 in FIG. 11 is not intended to indicate a particular geometric positioning of the quantum dots 142. Similar to the quantum dot device 100, in the quantum dot device 200, the spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 200. Descriptions of the n-type doped region 140, the p-type doped region 140, the interface material 141, how the voltages may be applied to the gates 106/108 to form quantum wells/barriers, how the gates 108 may be used as plunger gates while the gates 106 may be used as barrier gates, and of conductive vias and lines that may make contact with the gates 106/108 and with the doped regions 140, provided with respect to the quantum dot device 100 are applicable to the quantum dot device 200 and, therefore, are not repeated. As shown in FIGS. 10-12, the gates 106 may extend away from the fins 104, and conductive vias 120 may contact the gates 106 (and are drawn in dashed lines in FIG. 11 to indicate their location behind the plane of the drawing). The gates 108 may similarly extend away from the fins 104, and conductive vias 122 may contact the gates 108 (also drawn in dashed lines in FIG. 11 to indicate their location behind the plane of the drawing). The quantum dot device 200 may include further conductive vias and/or lines (not shown) to make electrical contact to the gates 106/108 and/or the doped regions 140, as desired. Descriptions of the bias voltage that may be applied to the doped regions 140 and of the conductive vias 120, 122, and 136, provided with respect to the quantum dot device 100 are applicable to the quantum dot device 200 and, therefore, are not repeated. Furthermore, although not shown in FIGS. 10-12, in some embodiments, the quantum dot device 200 may include one or more magnet lines such as the magnet line 121 described with reference to the quantum dot device 100.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 200 enables both quantum computation and the ability to read the results of a quantum computation.

As discussed above, the base 102 and the fin 104 of a quantum dot device 200 may be formed from a semiconductor substrate 144 and a quantum well stack 146 disposed on the semiconductor substrate 144. The quantum well stack 146 may include a quantum well layer in which a 2DEG may form during operation of the quantum dot device 200. The quantum well stack 146 may take any of a number of forms, several of which were illustrated in FIGS. 5-7 and were discussed above, which descriptions are, therefore, not repeated here.

The semiconductor substrate 144 and the quantum well stack 146 may be distributed between the base 102 and the fins 104 of the quantum dot device 200, as discussed above. This distribution may occur in any of a number of ways. For example, FIGS. 13-19 illustrate example base/fin arrangements 158 that may be used in a quantum dot device 200, in accordance with various embodiments.

Figure 13:
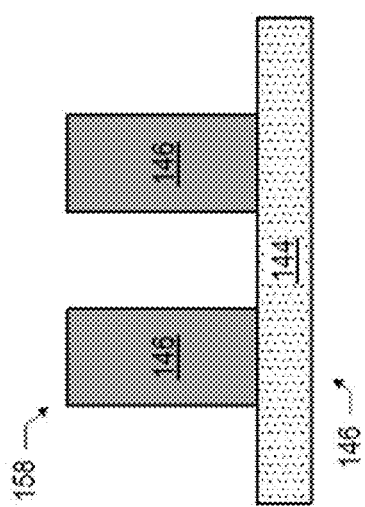

In the base/fin arrangement 158 of FIG. 13, the quantum well stack 146 may be included in the fins 104, but not in the base 102. The semiconductor substrate 144 may be included in the base 102, but not in the fins 104. Manufacturing of the base/fin arrangement 158 of FIG. 13 may include fin etching through the quantum well stack 146, stopping when the semiconductor substrate 144 is reached.

Figure 14:
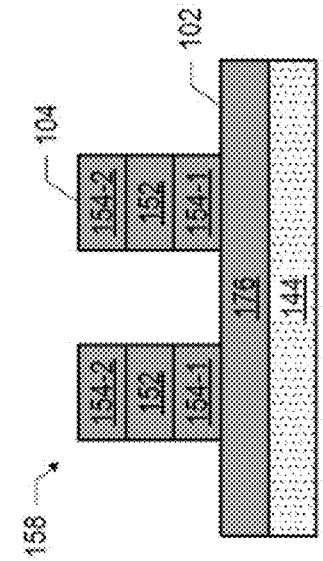
Figure 15:
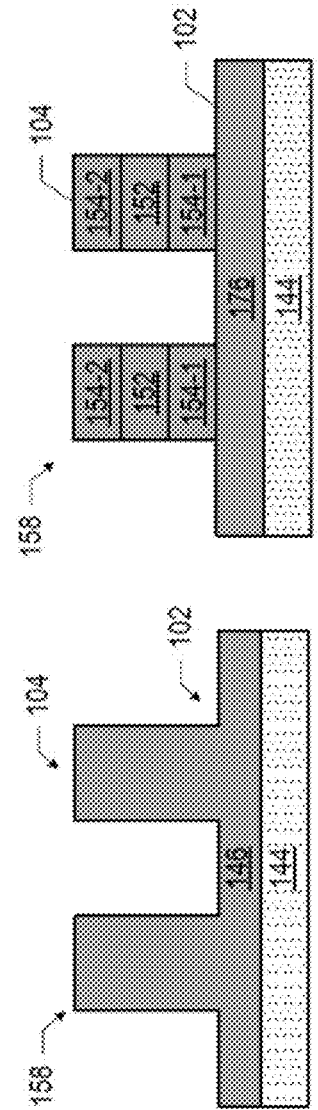

In the base/fin arrangement 158 of FIG. 14, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 14 may include fin etching that etches partially through the quantum well stack 146, and stops before the semiconductor substrate 144 is reached. FIG. 15 illustrates a particular embodiment of the base/fin arrangement 158 of FIG. 14. In the embodiment of FIG. 15, the quantum well stack 146 of FIG. 7 is used; the fins 104 include the barrier layer 154-1, the quantum well layer 152, and the barrier layer 154-2, while the base 102 includes the buffer layer 176 and the semiconductor substrate 144.

In the base/fin arrangement 158 of FIG. 16, the quantum well stack 146 may be included in the fins 104, but not the base 102. The semiconductor substrate 144 may be partially included in the fins 104, as well as in the base 102. Manufacturing the base/fin arrangement 158 of FIG. 16 may include fin etching that etches through the quantum well stack 146 and into the semiconductor substrate 144 before stopping. FIG. 17 illustrates a particular embodiment of the base/fin arrangement 158 of FIG. 16. In the embodiment of FIG. 17, the quantum well stack 146 of FIG. 7 is used; the fins 104 include the quantum well stack 146 and a portion of the semiconductor substrate 144, while the base 102 includes the remainder of the semiconductor substrate 144.

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 18, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 18. FIG. 19 illustrates a particular embodiment of the base/fin arrangement 158 of FIG. 18. In FIG. 19, the quantum well stack 146 is included in the tapered fins 104 while a portion of the semiconductor substrate 144 is included in the tapered fins and a portion of the semiconductor substrate 144 provides the base 102.

Example Quantum Dot Devices with On-Chip Microcoil Arrangements

Figure 20A:
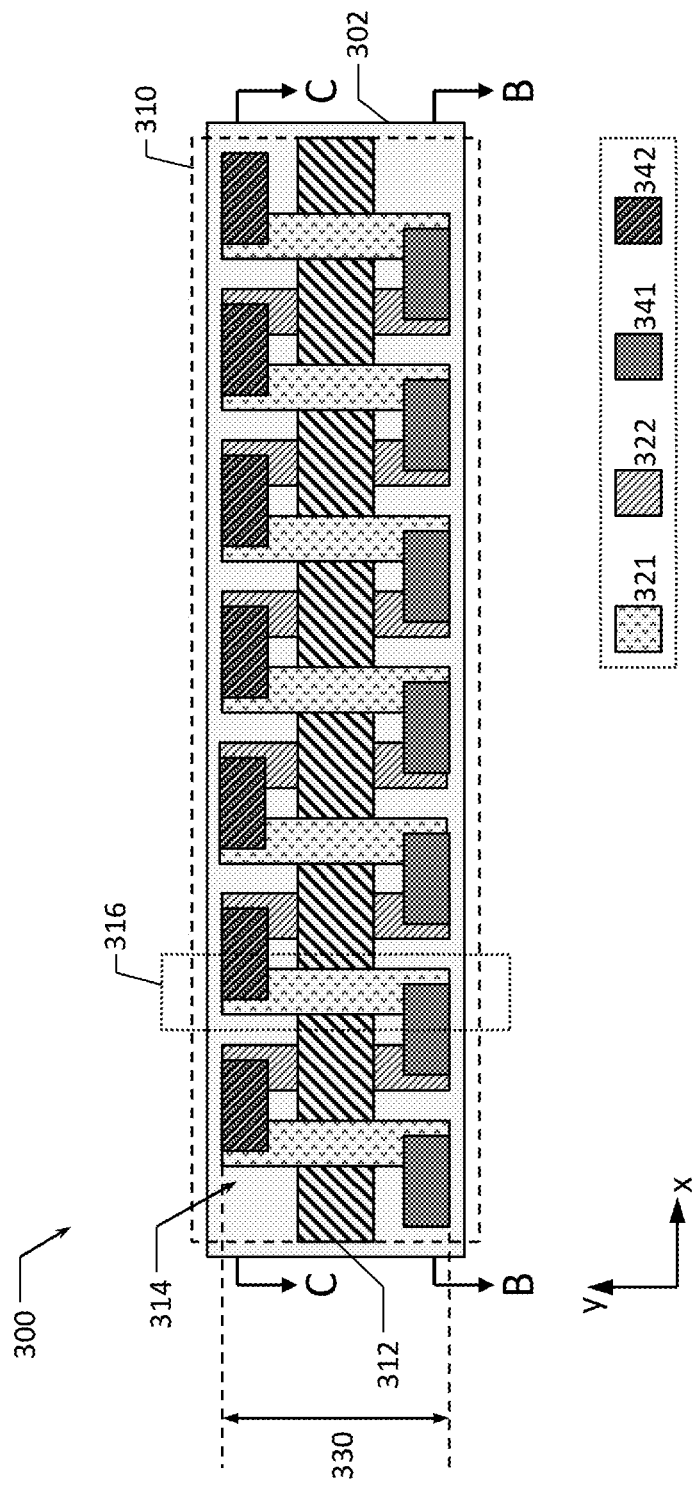
FIGS. 20A-20C are different cross-sectional views of a portion of an example quantum dot device with a horizontal on-chip microcoil arrangement, in accordance with some embodiments.
Figure 20B:
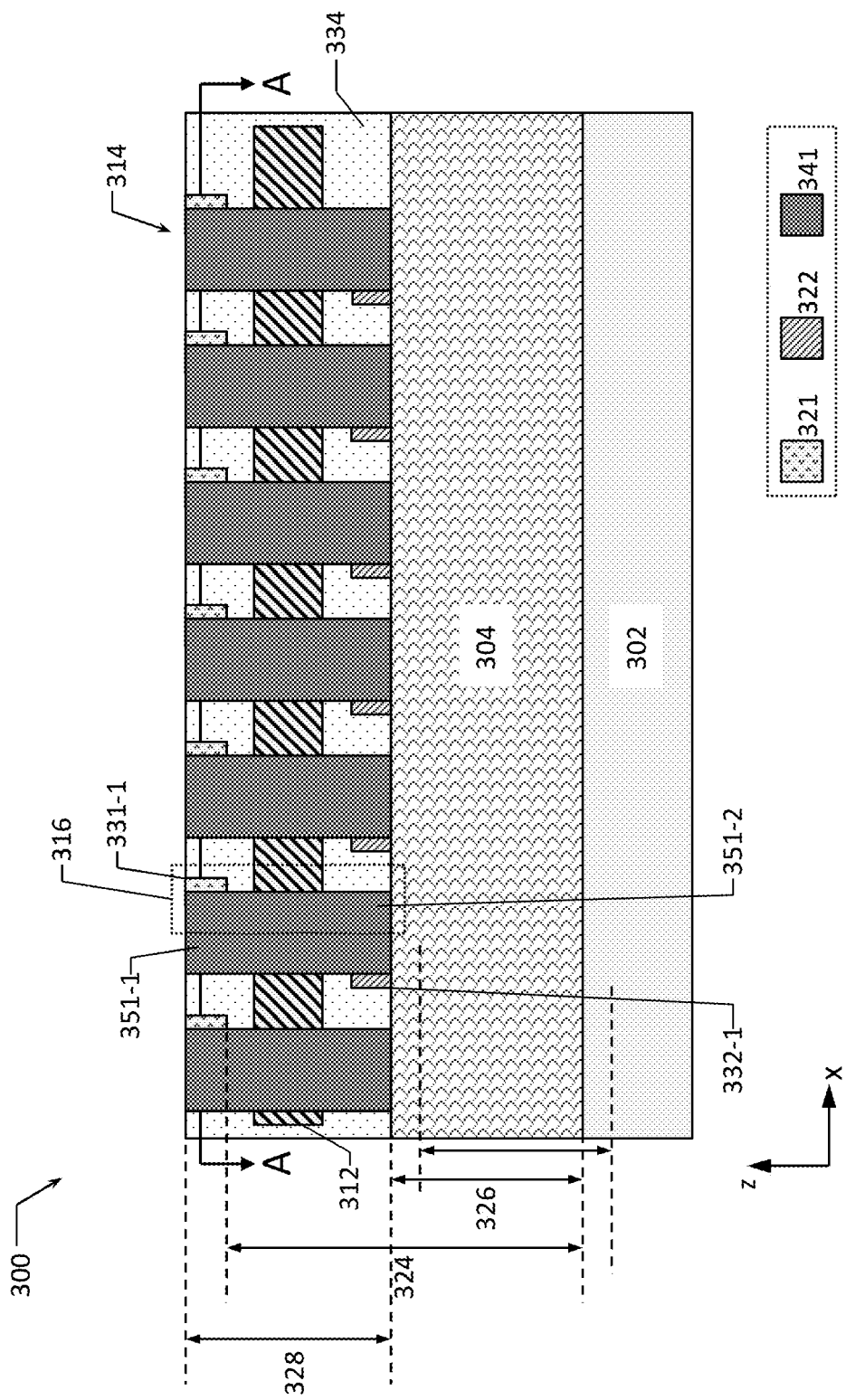
Figure 20C:
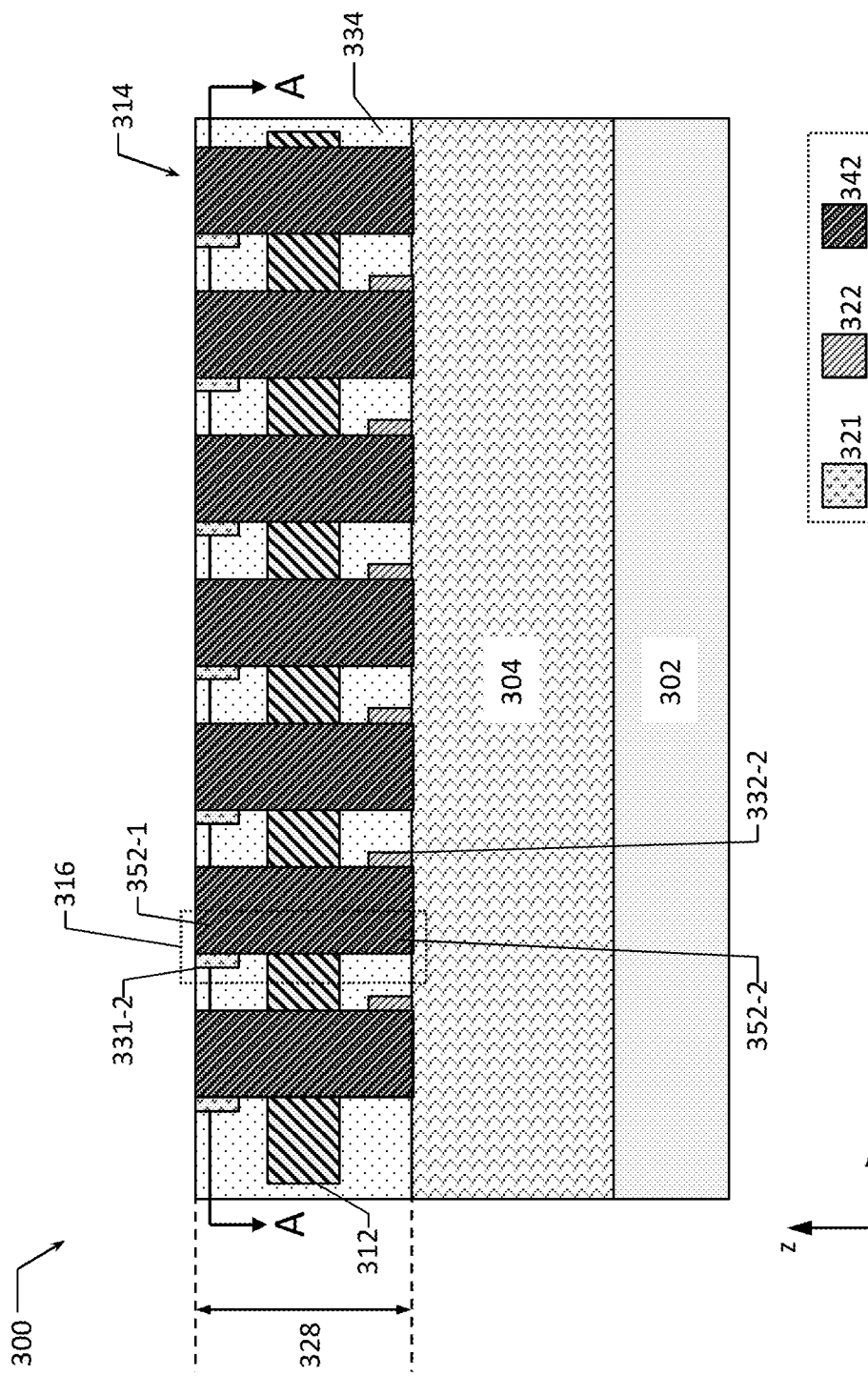

FIGS. 20A-20C are different cross-sectional views of a portion of an example quantum dot device 300 with a horizontal on-chip microcoil arrangement 310, in accordance with some embodiments. In particular, FIG. 20B illustrates a cross-section of the quantum dot device 300 taken along the section/plane B-B of FIG. 20A, FIG. 20C illustrates a cross-section of the quantum dot device 300 taken along the section/plane C-C of FIG. 20A, and FIG. 20A illustrates a cross-section of the quantum dot device 300 taken along the section/plane A-A of FIGS. 20B and 20C. With reference to an example coordinate system x-y-z that may be used to provide different views of a quantum dot device, FIGS. 20B and 20C provide cross-sectional side views across two different planes x-z, while FIG. 20A provides a top-down view across a plane x-y, with a number of components not shown in FIGS. 20A-20C to more readily illustrate the details of the on-chip microcoil arrangement 310 of the quantum dot device 300. The quantum dot device 300 may be implemented as any embodiments of the quantum dot devices 100 or 200, described above, or any other quantum dot devices that rely on formation of quantum dots for quantum computing operations.

A portion of the quantum dot device 300 within a rectangular dashed contour shown in FIG. 20A indicates an approximate outline of the on-chip microcoil arrangement 310. A number of elements referred to in the description of FIGS. 20A-20C with reference numerals are illustrated in FIGS. 20A-20C with different patterns in order to not clutter the drawings with too many reference numerals, with a legend showing the correspondence between the reference numerals and patterns being provided at the bottom of FIGS. 20A-20C. For example, the legend illustrates that FIGS. 20A-20C use different patterns to show first conductive lines 321, second conductive lines 322, first conductive vias 341, and second conductive vias 342.

The microcoil arrangement 310 may be provided over a support structure 302, with an intermediate layer 304 provided in between the support structure 302 and the microcoil arrangement 310. The support structure 302 may, e.g., be the wafer 1100 of FIG. 24, discussed below, and may be, or be included in, a die, e.g., the singulated die 1102 of FIG. 24, discussed below. The support structure 102 may be a semiconductor substrate composed of semiconductor material systems including, for example, n-type or p-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 302 may be a sapphire substrate. In some embodiments, the support structure 302 may be a printed circuit board (PCB) substrate. Although a few examples of materials from which the support structure 302 may be formed are described here, any material that may serve as a foundation upon which a quantum dot device with on-chip microcoil arrangements as described herein may be built falls within the spirit and scope of the present disclosure. The intermediate layer 304 may at least include the quantum well stack 146 as described herein. In some embodiments, the intermediate layer 304 may also include an arrangement of gates provided over the quantum well stack 146 as described herein, e.g., a plurality of gates extending to one or more quantum dot formation regions in the quantum well stack 146, as described herein.

As shown in FIG. 20, the microcoil arrangement 310 may include a core 312 and a microcoil 314 having a shape that wraps around the core 312 with a plurality of turns. Such a microcoil 314 may also be referred to as a "winding" because it winds around the core 312. The core 312 may include a ferromagnetic material or a ferrimagnetic material and may be formed to have an elongated shape, e.g., with the longitudinal axis extending along the x-axis of the example coordinate system shown in the present drawings. In various embodiments, the ferromagnetic materials that may be included in the core 312 may include transition metals such as iron, nickel, or cobalt, alloys of transition metals, alloys of rare earth metals, etc. In various embodiments, the ferrimagnetic materials that may be included in the core 312 may include one or more of magnetite, yttrium iron garnet (YIG), cubic ferrites that include iron oxides with other elements such as aluminum, cobalt, nickel, manganese, and zinc, hexagonal ferrites, etc. In some embodiments, the length of the core 312 (i.e., a dimension measured along the x-axis of the example coordinate system shown in FIGS. 20A-20C) may be between about 0.1 and 1000 micrometer (micron), including all values and ranges therein, e.g., between about 1 and 100 micron, or between about 10 and 50 micron. In some embodiments, an area of a cross-section of the core 312 in a plane substantially perpendicular to the longitudinal axis of the core 312 (i.e., a cross-section along the y-z plane of the example coordinate system shown in FIGS. 20A-20C) may be between about $0.05^2$ and $100^2$ square micron, including all values and ranges therein, e.g., between about $0.5^2$ and $10^2$ square micron, or between about 1 and $5^2$ square micron.

The microcoil 314 may include an electrically conductive material, e.g., a superconductive material such as any of the superconductive materials described above. The microcoil 314 may wrap around the core 312 in a shape that is like a helix or a coil. In some embodiments, such shape may be approximated by fabricating the microcoil 314 using a plurality of conductive lines and vias, e.g., as is shown in FIG. 20 with first conductive lines 321, second conductive lines 322, first conductive vias 341, and second conductive vias 342. The first conductive lines 321 are provided at a first distance 324 from the support structure 302, while the second conductive lines 322 are provided at a second distance 326 from the support structure 302 (labeled in FIG. 20B), where the first distance 324 is larger than the second distance 326. The first and second conductive vias 341, 342 may be provided in opposite x-z planes of the example coordinate system shown in FIGS. 20A-20C to provide electrical continuity between the first conductive lines 321 and the second conductive lines 322 so that the microcoil 314 may "wrap" around the core 312. Each of the with first conductive lines 321, second conductive lines 322, first conductive vias 341, and second conductive vias 342 may be defined as having a first end and a second end. An individual "turn" 316 of the plurality of turns of such a microcoil 314 may then include one instance of the first conductive line 321, one instance of the second conductive line 322, one instance of the first conductive via 341 having a first end 351-1 in conductive contact with a first end 331-1 of the first conductive line 321 and having a second end 351-2 in conductive contact with a first end 332-1 of the second conductive line 322 (labeled in FIG. 20B), and one instance of the second conductive via 342 having a first end 352-1 in conductive contact with the second end 331-2 of the first conductive line 321 and having a second end 352-2 in conductive contact with the second end 332-2 of the second conductive line 322 (labeled in FIG. 20C). A portion of the quantum dot device 300 within a rectangular dotted contour shown in each of FIGS. 20A-20C indicates an approximate outline of a single turn 316 of the on-chip microcoil arrangement 310. While FIGS. 20A-20C illustrate seven such turns 316, in other embodiments any other number of two or more turns may be implemented in the quantum dot device 300.

In some embodiments, a height 328 of the first conductive via 341 or the second conductive via 342 (i.e., a dimension measured along the z-axis of the example coordinate system shown in FIGS. 20A-20C) may be between about 0.01 and 100 micron, including all values and ranges therein, e.g., between about 0.1 and 10 micron, or between about 0.2 and 5 micron, and each of the first conductive vias 341 and the second conductive vias 342 may be substantially perpendicular to the support structure 302. In some embodiments, a length 330 of the first conductive line 321 or the second conductive line 322 (i.e., a dimension measured along the y-axis of the example coordinate system shown in FIGS. 20A-20C) may be between about 0.05 and 1000 micron, including all values and ranges therein, e.g., between about 0.1 and 100 micron, or between about 10 and 50 micron. Projections of the first conductive lines 321 and the second conductive lines 322 onto the support structure 302 (or, equivalently, onto any plane substantially parallel to the support structure 302) are shown in FIGS. 20A-20C to not be overlapping with one another; however, in other embodiments, these projections may partially overlap for at least some of the turns 316. In some embodiments, a distance between a projection of the first conductive line 321 and a projection of the second conductive line 322 onto a plane parallel to the support structure 302 may be below about 10 micron, including all values and ranges therein, e.g., between about 0 and 0.5 micron, or between about 0.1 and 0.4 micron. An insulating material 334, e.g., the low-k dielectric material, may be provided to ensure electrical insulation between the core 312 and the microcoil 314. Such an insulating material may include any of the insulating materials described herein, e.g., any of the materials described with reference to the insulating material 128 or the insulating material 130. In some embodiments, an average distance between the microcoil 314 and the core 312 may be between about 0.001 and 20 micron, including all values and ranges therein, e.g., between about 0.005 and 1 micron, or between about 0.01 and 0.1 micron.

The microcoil arrangement 310 may be included in a quantum dot device in any suitable location where magnetic field generated by the microcoil arrangement 310 can reach the qubits. For example, in some embodiments, the microcoil arrangement 310 may be included in any of the locations described above with reference to the magnet line 121 (e.g., in such embodiments, the microcoil arrangement 310 may replace the magnet line 121). Some other considerations with respect to placement of the microcoil arrangement 310 are described with reference to FIGS. 22A-22D.

Figure 21:
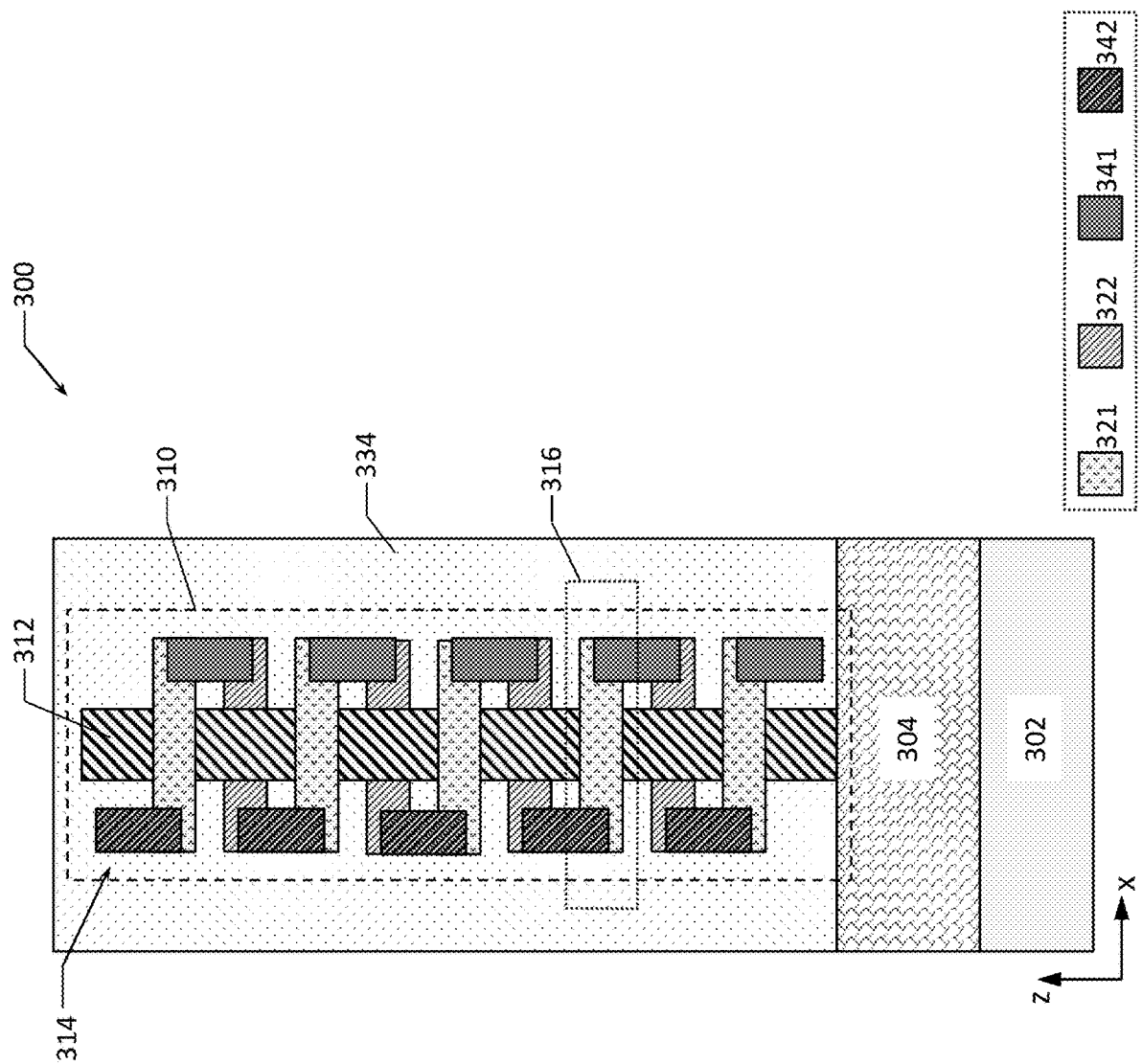
FIG. 21 is a cross-sectional view of a portion of an example quantum dot device with a vertical on-chip microcoil arrangement, in accordance with some embodiments.

FIGS. 20A-20C illustrate embodiments of the microcoil arrangement where the core 312 is substantially parallel to the support structure 302. However, in other embodiments, an analogous microcoil arrangement 310 may be implemented with the core 312 being substantially perpendicular to the support structure 302. An example of this is shown in FIG. 21, providing a cross-sectional side view of a portion of an example quantum dot device 300 with a vertical on-chip microcoil arrangement 310, in accordance with some embodiments. The descriptions of the horizontal microcoil arrangement 310 provided with respect to FIGS. 20A-20C are applicable to the vertical microcoil arrangement 310 as shown in FIG. 21, except that the longitudinal axis of the core 312 extends along the z-axis of the example coordinate system shown in the present drawings, and the corresponding changes to the winding provided by the microcoil 314.

FIGS. 22A-22D are different cross-sectional views of a portion of an example quantum dot device 400 with an arrangement of gates and on-chip microcoil arrangements 310, in accordance with some embodiments. The quantum dot device 400 may be any of the quantum dot devices described above, and any of the on-chip microcoil arrangements 310 of the quantum dot device 400 may be implemented according to any of the embodiments of the on-chip microcoil arrangements 310 described above. For example, in some embodiments, any or all of the on-chip microcoil arrangements 310 of the quantum dot device 400 may be horizontal on-chip microcoil arrangements 310, in some embodiments any or all of the on-chip microcoil arrangements 310 of the quantum dot device 400 may be vertical on-chip microcoil arrangements 310, and, in some embodiments, one or more of the on-chip microcoil arrangements 310 of the quantum dot device 400 may be horizontal on-chip microcoil arrangements 310 while other one or more of the on-chip microcoil arrangements 310 of the quantum dot device 400 may be vertical on-chip microcoil arrangements 310.

Figure 22D:
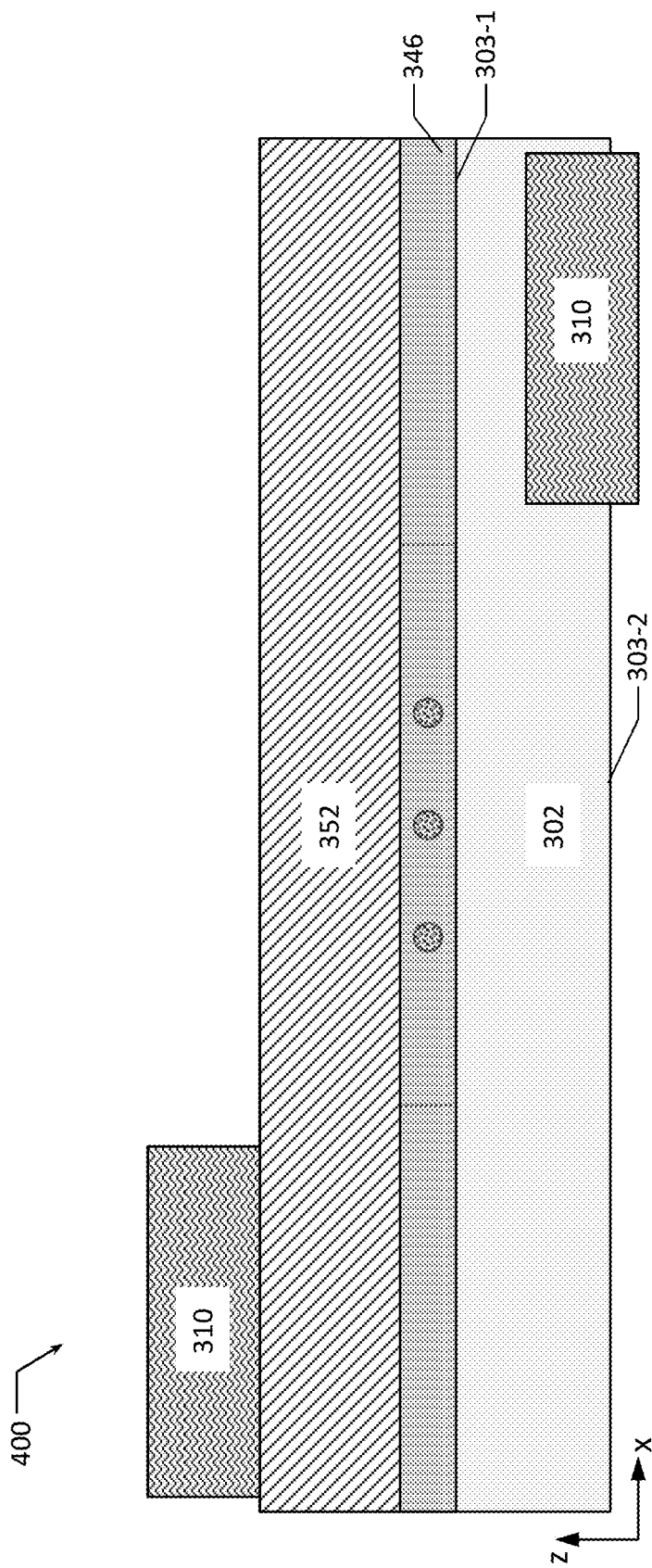
Figure 23:
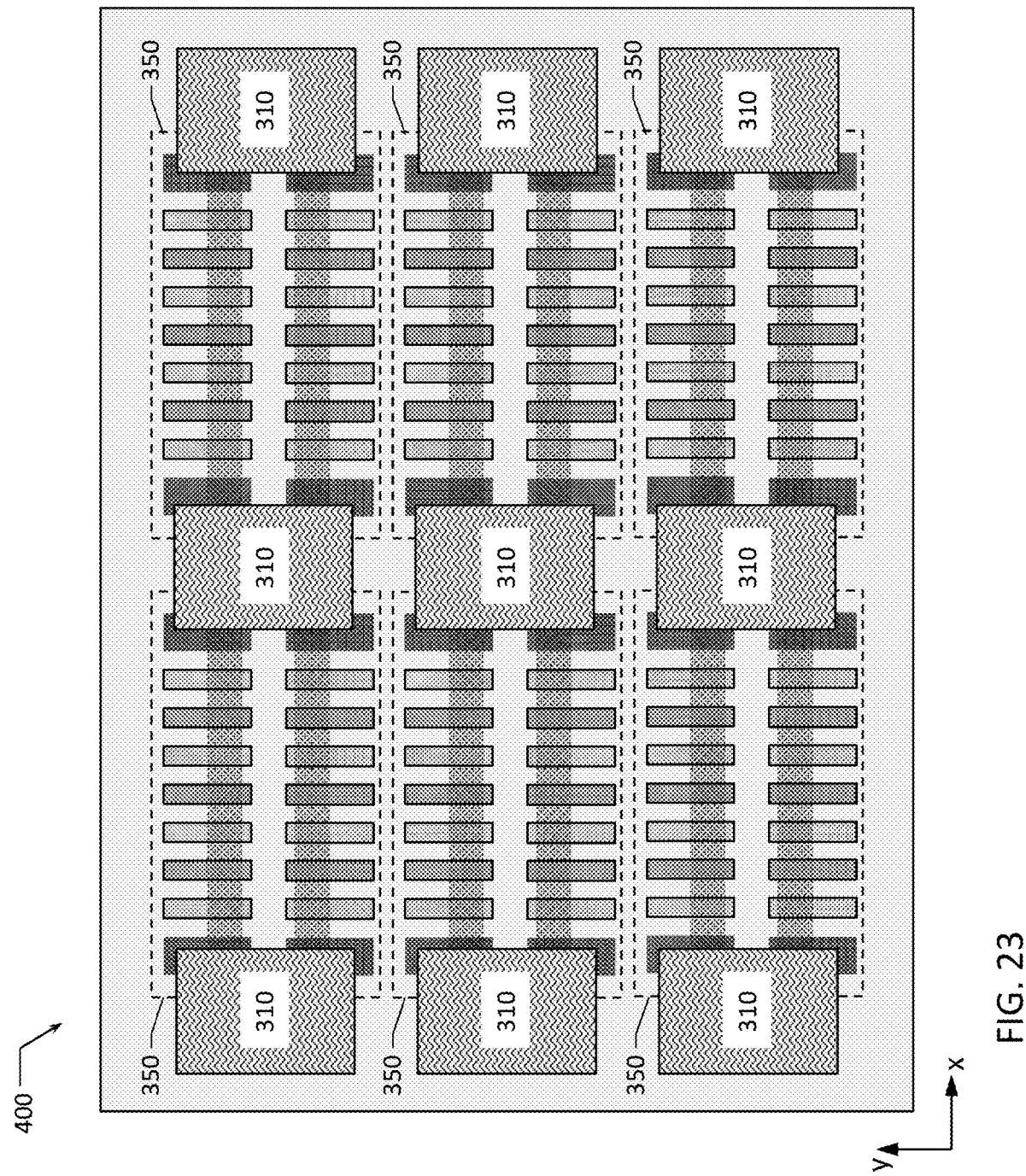
FIG. 23 is a cross-sectional view of a portion of an example quantum dot device with multiple arrangements of gates and multiple on-chip microcoil arrangements, in accordance with some embodiments.

FIG. 22D illustrates a top-down view (x-y plane) of the quantum dot device 400, illustrating two microcoil arrangements 310 as described above, one on either side of an arrangement 350 of gates. The view of FIG. 22A is similar to the top-down cross-sectional views of FIGS. 4 and 12, except that it is shown for examples of quantum dot devices with more gates than just the five gates for each of the two quantum dot formation regions 111 shown in the examples of FIGS. 4 and 12. Similar to FIGS. 4 and 12, the view of FIG. 22A illustrates two quantum dot formation regions 111—a quantum dot formation region 111-1 for the active gates and a quantum dot formation region 111-2 for the read gates, where FIG. 22A illustrates a horizontal rectangular contour enclosing the approximate boundaries of the quantum dot formation regions 111-1 and 111-2. In particular, FIG. 22D illustrates an example with the active gates including three barrier gates, labeled as gates $B_0$ through $B_3$, three plunger gates, labeled as gates $P_1$ through $P_3$, and two accumulation gates, labeled as gates $A_1$ and $A_2$. However, in other embodiments, the microcoil arrangements 310 may be provided on either side of a gate arrangement 350 that may include any other suitable arrangement of gates and quantum dot formations regions for a quantum dot device besides the example of the gate arrangement 350 shown in FIG. 22A.

FIGS. 22B-22D illustrate different embodiments of a cross-sectional side view (x-z plane) of the quantum dot device 400 with the two microcoil arrangements 310 and the gate arrangement 350 of FIG. 22A. In particular, each of FIGS. 22B-22D illustrates that the quantum dot device 400 may include the support structure 302, a quantum well stack layer 346 and a gate arrangement layer 352, so that the quantum well stack layer 346 is between the support structure 302 and the gate arrangement layer 352. The quantum well stack layer 346 is a layer in which the quantum well stack 146 according to any embodiments described herein may be implemented and in which quantum dots may be formed during operation of the quantum dot device 400, e.g., as described above with reference to the quantum dot devices 100 and 200. The gate arrangement layer 352 is a layer that includes a plurality of gates for controlling formation and manipulation of the quantum dots in the quantum well stack layer 346 according to any embodiments described herein, e.g., as described above with reference to the quantum dot devices 100 and 200. For example, the gate arrangement layer 352 may include the gate arrangement 350 of FIG. 22A.

In each of FIGS. 22B-22D, a first face/surface 303-1 and an opposing second face/surface 303-2 of the support structure 302 are labeled. FIG. 22B illustrates an embodiment where the each of the quantum well stack layer 346, the gate arrangement layer 352, and the microcoil arrangements 310 are provided over the first face 303-1 of the support structure 302. FIG. 22C illustrates an embodiment where the quantum well stack layer 346 and the gate arrangement layer 352 are provided over the first face 303-1 of the support structure 302 but the microcoil arrangements 310 is provided over the second face 303-2 of the support structure 302. FIG. 22D illustrates an embodiment where each of the quantum well stack layer 346, the gate arrangement layer 352, and the first microcoil arrangement 310 are provided over the first face 303-1 of the support structure 302 but the second microcoil arrangement 310 is provided over the second face 303-2 of the support structure 302.

In some of the embodiments where one or more of the microcoil arrangements 310 are provided on the backside of the support structure 302 (i.e., on the side opposite to the one where the quantum well stack layer 346 and the gate arrangement layer 352 are provided), the support structure 302 may be thinned prior to providing the one or more of the microcoil arrangements 310 over the backside. For example, in the embodiments of FIG. 22C or 22D, a thickness of the support structure 302 (i.e., a dimension measured along the z-axis of the example coordinate system shown) may be reduced to be between about 0.001 and 1000 micron, including all values and ranges therein, e.g., between about 0.1 and 100 micron or between about 0.5 and 10 micron. Any backside grinding techniques may be used to thin the support structure 302.

In other embodiments where one or more of the microcoil arrangements 310 are provided on the backside (e.g., over the second face 303-2) of the support structure 302, portions of the support structure 302 from the backside may be removed to form openings and the microcoil arrangements 310 may be provided in the openings. This provides another manner in which the microcoil arrangements 310 provided on the second face 303-2 may be brought sufficiently close to the quantum dot formation regions of the quantum dot device 400.

In yet other embodiments where one or more of the microcoil arrangements 310 are provided on the backside (e.g., over the second face 303-2) of the support structure 302, wafer bonding may be used where the microcoil arrangements 310 are provided over another substrate/wafer, but that substrate/wafer is then bonded to the second face 303-2 of the support structure that includes the quantum dot device 400, so that the microcoil arrangements 310 are sufficiently close to the quantum dot formation regions of the quantum dot device 400.

In further embodiments, multiple gate arrangements 350 and multiple microcoil arrangements 310 may be provided in a single quantum dot device, an example of which is illustrated in FIG. 23, showing a cross-sectional top-down view of a portion of an example quantum dot device 400 with multiple gate arrangements 350 and multiple on-chip microcoil arrangements 310, in accordance with some embodiments. FIG. 23 illustrates that, in some embodiments, a single microcoil arrangement 310 may be shared among two (or more) gate arrangements 350. In such embodiments, any of the microcoil arrangements 310 may be implemented according to any embodiments described herein and may be provided over any face/surface of a support structure.

Various arrangements of the quantum dot devices 100, 200, 300, and 400 as illustrated in the present drawings do not represent an exhaustive set of quantum dot devices with on-chip microcoil arrangements as described herein, but merely provide examples of such devices. In various embodiments, any of the features described with reference to one of the quantum dot devices 100, 200, 300, and 400 may be combined with any of the features described with reference to another one of the quantum dot devices 100, 200, 300, and 400. For example, in some embodiments, any embodiments of the quantum dot devices 100 may include one or more microcoil arrangements 310 either on the frontside or the backside of the support structure as was described with reference to FIGS. 22A-22D. In another example, a single quantum dot device with one or more microcoil arrangements 310 may include both quantum dot formation regions according to trench-based embodiments as described with reference to FIGS. 1-4 and quantum dot formation regions according to fin-based embodiments as described with reference to FIGS. 10-12. Still further, any of the quantum dot devices may include quantum dot formation regions that are formed according to embodiments other than trench-based or fin-based. Moreover, while the microcoil arrangements 310 have been described here as having a single microcoil 314 winding around the core 312, in other embodiments, any of the microcoil arrangements 310 described herein may include multiple windings (i.e., multiple instances of the microcoil 314) winding around a given core 312, e.g., provided at distance from one another and at a distance to the core 312. Furthermore, in some embodiments, any of the microcoil arrangements 310 described herein may be included in multiple layers in any of the quantum dot devices described herein.

Example Devices and Systems

Quantum dot devices with on-chip microcoil arrangements as described above may be implemented using any kind of qubit devices or be included in any kind of quantum processing devices/structures. Some examples of such devices/structures are illustrated in FIGS. 23-26.

Figure 24:
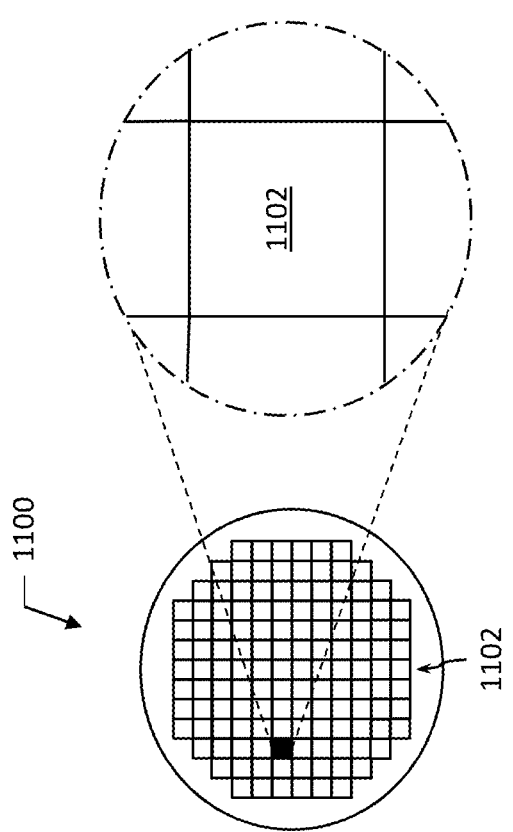
FIG. 24 is a top view of a wafer and dies that may include one or more of quantum dot devices disclosed herein.

FIG. 24 is a top view of a wafer 1100 and dies 1102 that may be formed from the wafer 1100, according to some embodiments of the present disclosure. The dies 1102 may include any of the quantum dot devices with on-chip microcoil arrangements disclosed herein, e.g., any embodiments of the quantum dot devices 300 or 400 as described herein, or any combinations of such quantum dot devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 26) or other logic that is configured to store information in the memory devices or execute instructions stored in the memory array.

Figure 25:
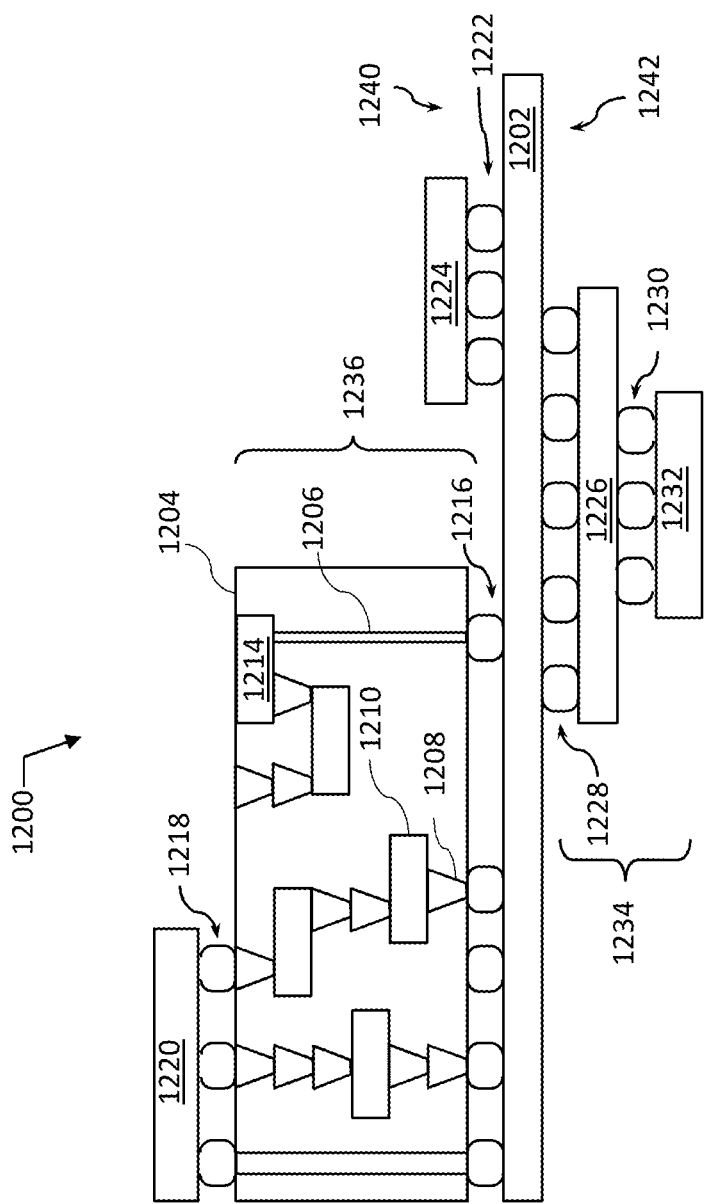
FIG. 25 is a cross-sectional side view of a device assembly that may include one or more of quantum dot devices disclosed herein.

FIG. 25 is a cross-sectional side view of a device assembly 1200 that may include any of the embodiments of the quantum dot devices with on-chip microcoil arrangements as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 25 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 25), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 25, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum dot devices with on-chip microcoil arrangements as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 25, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum dot devices with on-chip microcoil arrangements disclosed herein; or may be a conventional IC package, for example.

The device assembly 1200 illustrated in FIG. 25 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 26:
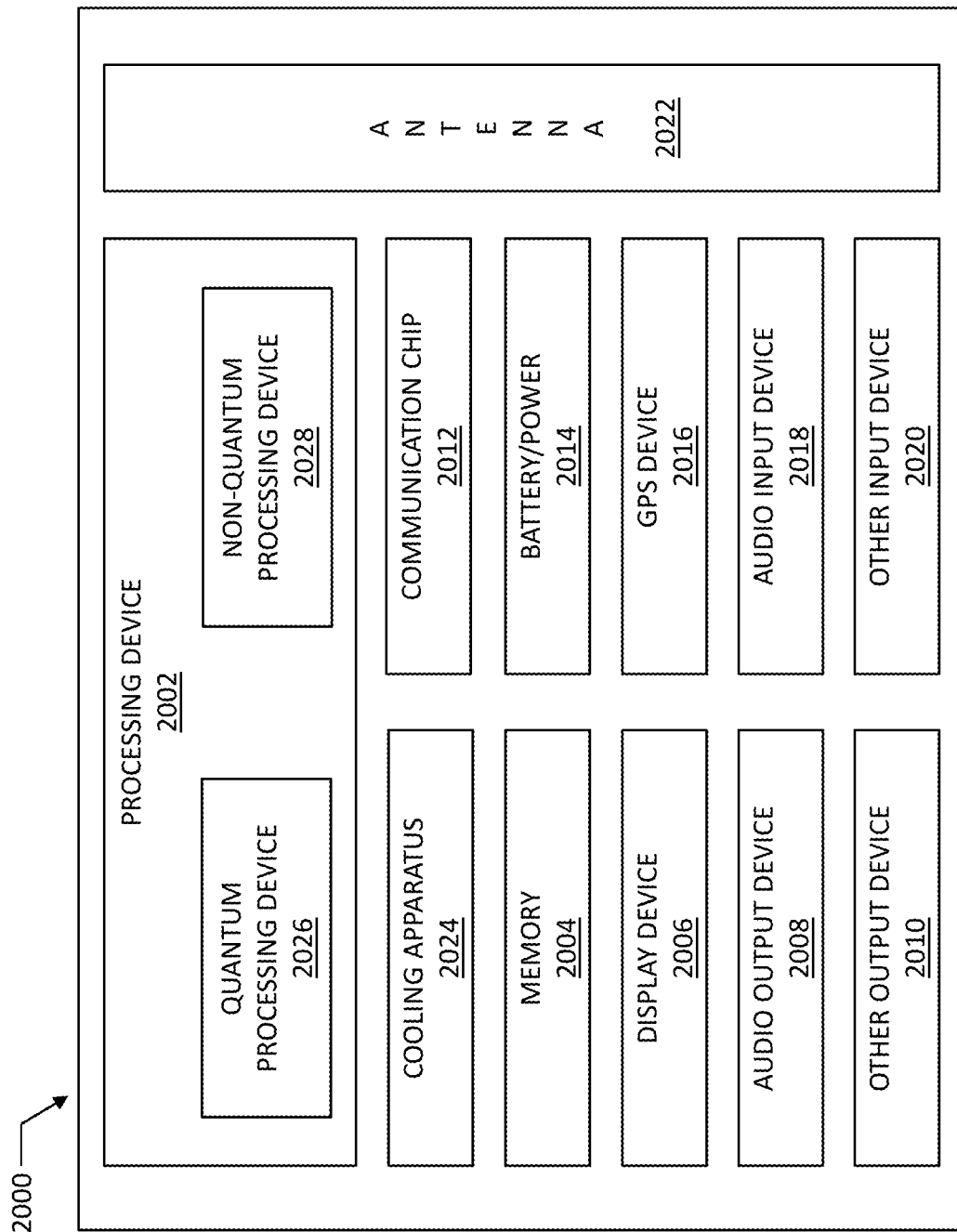
FIG. 26 is a block diagram of an example quantum computing device that may include one or more of quantum dot devices disclosed herein, in accordance with various embodiments.

FIG. 26 is a block diagram of an example quantum computing device 2000 that may include any of the quantum dot devices with on-chip microcoil arrangements as disclosed herein, or any combinations of such quantum dot devices. Several components are illustrated in FIG. 26 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum dot devices with on-chip microcoil arrangements as described herein. In some embodiments, various ones of these components may be fabricated onto a single system-on-a-chip (SoC) die. Additionally, in various embodiments, the quantum computing device 2000 may not include one or more of the components illustrated in FIG. 26, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum dot devices with on-chip microcoil arrangements as disclosed herein, and may perform data processing by performing operations on the qubits that may be generated in the quantum dot devices 300, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum dot device that includes a support structure (e.g., a substrate, a chip, a wafer, or a die); a quantum well stack structure over the support structure, the quantum well stack structure including a quantum dot formation region; a plurality of gates over the support structure, the plurality of gates extending to the quantum dot formation region; and a microcoil arrangement over the support structure, the microcoil arrangement proximate to the plurality of gates and including a core including a ferromagnetic material or a ferrimagnetic material having an elongated shape, and a microcoil including an electrically conductive material, the microcoil having a shape that wraps around the core with a plurality of turns.

Example 2 provides the quantum dot device according to example 1, where the shape is a helix or a coil.

Example 3 provides the quantum dot device according to examples 1 or 2, where a length of the core (e.g., a dimension measured along the x-axis of the example coordinate system shown in FIG. 20) is between about 0.1 and 1000 micron, including all values and ranges therein, e.g., between about 1 and 100 micron, or between about 10 and 50 micron.

Example 4 provides the quantum dot device according to example 3, where an area of a cross-section of the core in a plane substantially perpendicular to a longitudinal axis of the core (e.g., a cross-section along the y-z plane of the example coordinate system shown in FIG. 20) is between about $0.05^2$ and $100^2$ square micron, including all values and ranges therein, e.g., between about $0.5^2$ and $10^2$ square micron, or between about 1 and $5^2$ square micron.

Example 5 provides the quantum dot device according to any one of the preceding examples, where an average distance between the microcoil and the core is between about 0.001 and 20 micron, including all values and ranges therein, e.g., between about 0.005 and 1 micron, or between about 0.01 and 0.1 micron.

Example 6 provides the quantum dot device according to any one of the preceding examples, further including an insulating material between the microcoil and the core, e.g., a low-k dielectric material.

Example 7 provides the quantum dot device according to any one of the preceding examples, where an individual turn of the plurality of turns of the microcoil includes a first conductive line at a first distance from the support structure, a second conductive line at a second distance from the support structure and offset with respect to the first conductive line, where the first distance is larger than the second distance and where each of the first conductive line and the second conductive line has a first end and an opposing second end, a first conductive via having a first end in conductive contact with the first end of the first conductive line and having a second end in conductive contact with the first end of the second conductive line, and a second conductive via having a first end in conductive contact with the second end of the first conductive line and having a second end in conductive contact with the second end of the second conductive line.

Example 8 provides the quantum dot device according to example 7, where a height of the first conductive via or the second conductive via (e.g., a dimension measured along the z-axis of the example coordinate system shown in FIG. 20) is between about 0.01 and 100 micron, including all values and ranges therein, e.g., between about 0.1 and 10 micron, or between about 0.2 and 5 micron.

Example 9 provides the quantum dot device according to examples 7 or 8, where each of the first conductive via and the second conductive via is substantially perpendicular to the support structure.

Example 10 provides the quantum dot device according to any one of examples 7-9, where a length of the first conductive line or the second conductive line (e.g., a dimension measured along the y-axis of the example coordinate system shown in FIG. 20) is between about 0.05 and 1000 micron, including all values and ranges therein, e.g., between about 0.1 and 100 micron, or between about 10 and 50 micron.

Example 11 provides the quantum dot device according to any one of examples 7-10, where a distance between a projection of the first conductive line and a projection of the second conductive line onto a plane parallel to the support structure is below about 10 micron, including all values and ranges therein, e.g., between about 0 and 0.5 micron, or between about 0.1 and 0.4 micron.

Example 12 provides the quantum dot device according to any one of examples 1-11, where the support structure has a first face and an opposing second face, the quantum well stack structure and the plurality of gates are over the first face of the support structure, and the microcoil arrangement is over the second face of the support structure.

Example 13 provides the quantum dot device according to any one of examples 1-11, where the support structure has a first face and an opposing second face, and each of the quantum well stack structure, the plurality of gates, and the microcoil arrangement is over the first face of the support structure.

Example 14 provides the quantum dot device according to any one of examples 1-11, where the support structure has a first face and an opposing second face, the microcoil arrangement is a first microcoil arrangement of a plurality of microcoil arrangements over the support structure, each of the quantum well stack structure, the plurality of gates, and the first microcoil arrangement is over the first face of the support structure, and a second microcoil arrangement of the plurality of microcoil arrangements is over the second face of the support structure.

Example 15 provides a quantum computing device that includes a quantum processing device, including a plurality of spin qubits, a plurality of gates coupled to individual ones of the plurality of spin qubits, and a microcoil arrangement to generate a magnetic field for manipulating the plurality of spin qubits; a non-quantum processing device, coupled to the quantum processing device, to control voltages applied to the plurality of gates; and a memory device to store data generated during operation of the quantum processing device.

Example 16 provides the quantum computing device of example 15, where the microcoil arrangement includes an elongated core that includes a ferromagnetic material or a ferrimagnetic material, and electrically conductive lines and vias, arranged in conductive contact with one another along a substantially helical contour around the elongated core.

Example 17 provides the quantum computing device according to 15 or 16, further including a cooling apparatus to maintain a temperature of the quantum processing device below 5 degrees Kelvin.

Example 18 provides the quantum computing device according to any one of examples 15-17, where the memory device is to store instructions for a quantum computing algorithm to be executed by the quantum processing device.

Example 19 provides a method of manufacturing a quantum dot device, the method including providing a plurality of spin qubits over a support structure (e.g., a substrate, a chip, a wafer, or a die); providing a plurality of gates over the support structure, the plurality of gates extending to individual ones of the plurality of spin qubits; and providing a microcoil arrangement over the support structure, the microcoil arrangement proximate to the plurality of gates and including a core including a ferromagnetic material or a ferrimagnetic material having an elongated shape, and a microcoil including an electrically conductive material, the microcoil having a shape that wraps around the core with a plurality of turns.

Example 20 provides the method according to example 19, where the microcoil includes electrically conductive lines and vias, arranged in conductive contact with one another along a substantially helical contour around the core.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
a support structure;
a quantum well stack over the support structure, the quantum well stack including a quantum dot formation region;
a plurality of gates over the support structure, the plurality of gates extending to the quantum dot formation region; and
a microcoil arrangement over the support structure, the microcoil arrangement proximate to the plurality of gates and including:
a core comprising a ferromagnetic material or a ferrimagnetic material having an elongated shape, and
a microcoil comprising an electrically conductive material, the microcoil winding around the core with a plurality of turns.

2. The quantum dot device according to claim 1, wherein a shape of the microcoil is substantially a helix or a coil.

3. The quantum dot device according to claim 1, wherein a length of the core is between about 100 nanometers and 1000 microns.

4. The quantum dot device according to claim 3, wherein an area of a cross-section of the core in a plane substantially perpendicular to a longitudinal axis of the core is between about $0.05^2$ and $100^2$ square microns.

5. The quantum dot device according to claim 1, wherein an average distance between the microcoil and the core is between about 1 nanometer and 20 microns.

6. The quantum dot device according to claim 1, further comprising an insulating material between the microcoil and the core.

7. The quantum dot device according to claim 1, wherein an individual turn of the plurality of turns of the microcoil includes:
- a first conductive line at a first distance from the support structure,
- a second conductive line at a second distance from the support structure and offset with respect to the first conductive line, where the first distance is larger than the second distance and where an individual one of the first conductive line and the second conductive line has a first end and an opposing second end,
- a first conductive via having a first end in conductive contact with the first end of the first conductive line and having a second end in conductive contact with the first end of the second conductive line, and
- a second conductive via having a first end in conductive contact with the second end of the first conductive line and having a second end in conductive contact with the second end of the second conductive line.

8. The quantum dot device according to claim 7, wherein a height of the first conductive via or the second conductive via is between about 10 nanometers and 100 microns.

9. The quantum dot device according to claim 7, wherein the first conductive via and the second conductive via are substantially perpendicular to the support structure.

10. The quantum dot device according to claim 7, wherein a length of the first conductive line or the second conductive line is between about 50 nanometers and 1000 microns.

11. The quantum dot device according to claim 7, wherein a distance between a projection of the first conductive line and a projection of the second conductive line onto a plane parallel to the support structure is below about 10 microns.

12. The quantum dot device according to claim 1, wherein:
- the support structure has a first face and an opposing second face,
- the quantum well stack and the plurality of gates are over the first face of the support structure, and
- the microcoil arrangement is over the second face of the support structure.

13. The quantum dot device according to claim 1, wherein
- the support structure has a first face and an opposing second face, and
- the quantum well stack, the plurality of gates, and the microcoil arrangement are over the first face of the support structure.

14. The quantum dot device according to claim 1, wherein:
- the support structure has a first face and an opposing second face,
- the microcoil arrangement is a first microcoil arrangement of a plurality of microcoil arrangements over the support structure,
- the quantum well stack, the plurality of gates, and the first microcoil arrangement are over the first face of the support structure, and
- a second microcoil arrangement of the plurality of microcoil arrangements is over the second face of the support structure.

15. A quantum computing device, comprising:
- a quantum processing device, comprising a plurality of spin qubits, a plurality of gates coupled to individual ones of the plurality of spin qubits, and a microcoil arrangement to generate a magnetic field for manipulating the plurality of spin qubits;
- a non-quantum processing device, coupled to the quantum processing device, to control voltages applied to the plurality of gates; and
- a memory device to store data generated during operation of the quantum processing device.

16. The quantum computing device according to claim 15, wherein the microcoil arrangement includes:
- an elongated core that includes a ferromagnetic material or a ferrimagnetic material, and
- conductive lines and vias, arranged in conductive contact with one another along a substantially helical contour around the elongated core.

17. The quantum computing device according to claim 15, further comprising:
- a cooling apparatus to maintain a temperature of the quantum processing device below 5 degrees Kelvin.

18. The quantum computing device according to claim 15, wherein the memory device is to store instructions for a quantum computing algorithm to be executed by the quantum processing device.

19. A method of manufacturing a quantum dot device, the method comprising:
- providing a plurality of spin qubits over a support structure;
- providing a plurality of gates over the support structure, the plurality of gates extending to individual ones of the plurality of spin qubits; and
- providing a microcoil arrangement over the support structure, the microcoil arrangement proximate to the plurality of gates and including:
  - a core comprising a ferromagnetic material or a ferrimagnetic material having an elongated shape, and
  - a microcoil comprising an electrically conductive material, the microcoil having a shape that wraps around the core with a plurality of turns.

20. The method according to claim 19, wherein the microcoil includes conductive lines and vias, arranged in conductive contact with one another along a substantially helical contour around the core.

* * * * *